(12) United States Patent
Song

(10) Patent No.: US 8,603,914 B2
(45) Date of Patent: Dec. 10, 2013

(54) LIQUID CRYSTAL DISPLAY DEVICE AND FABRICATION METHOD THEREOF

(75) Inventor: In-Duk Song, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 903 days.

(21) Appl. No.: 12/005,631

(22) Filed: Dec. 28, 2007

(65) Prior Publication Data
US 2008/0213472 A1 Sep. 4, 2008

(30) Foreign Application Priority Data
Mar. 2, 2007 (KR) .......... 10-2007-0021116

(51) Int. Cl.
*H01L 21/44* (2006.01)

(52) U.S. Cl.
USPC .......... 438/670; 349/143

(58) Field of Classification Search
USPC .......... 438/670, 155; 257/E21.411; 349/38, 349/143
See application file for complete search history.

(56) References Cited

U.S. PATENT DOCUMENTS

| | | | |
|---|---|---|---|
| 7,172,913 B2 * | 2/2007 | Lee et al. | 438/158 |
| 7,205,571 B2 * | 4/2007 | Ahn et al. | 438/155 |
| 7,316,944 B2 * | 1/2008 | Ahn | 438/155 |
| 7,518,666 B2 * | 4/2009 | Jung et al. | 349/43 |
| 7,619,694 B2 * | 11/2009 | Lee et al. | 349/38 |
| 7,696,088 B2 * | 4/2010 | Long et al. | 438/670 |
| 2005/0270434 A1 * | 12/2005 | Jung et al. | 349/43 |
| 2006/0145161 A1 * | 7/2006 | Lee et al. | 257/72 |
| 2007/0002247 A1 * | 1/2007 | Lee | 349/141 |

FOREIGN PATENT DOCUMENTS

| | | |
|---|---|---|
| CN | 101034262 | 9/2007 |
| KR | 10-2005-0068979 | 7/2005 |
| KR | 10-2005-0122465 | 12/2005 |
| KR | 10-2006-0015171 | 2/2006 |
| KR | 10-2006-0036243 | 4/2006 |

* cited by examiner

*Primary Examiner* — Stephen W Smoot
*Assistant Examiner* — Sun M Kim
(74) *Attorney, Agent, or Firm* — McKenna Long & Aldridge, LLP

(57) ABSTRACT

A method includes: forming a gate electrode and a gate line at a pixel part of a first substrate through a first masking process; forming a gate insulation film; forming an active pattern and source/drain electrodes and forming a data line crossing the gate line through a second masking process; forming a passivation layer; forming a photosensitive film pattern including a first pattern and a second pattern through a third masking process; selectively removing a portion of the passivation layer to form a first contact hole exposing a portion of the drain electrode; removing portions of the first and second patterns to remove the second pattern and form a third pattern; removing the third pattern and a conductive film on the third pattern to form a pixel electrode electrically connected with the drain electrode via the first contact hole; and attaching the first and second substrates.

7 Claims, 21 Drawing Sheets

LIQUID CRYSTAL DISPLAY DEVICE AND FABRICATION METHOD THEREOF

This application claims the benefit of Korean Patent Application No. 10-2007-0021116 filed on Mar. 2, 2007, which is hereby incorporated by reference for all purposes as if fully set forth herein.

BACKGROUND OF THE INVENTION

1. Field of the Invention

The present invention relates to a display device and, more particularly, to a method for fabricating a liquid crystal display device. Although embodiments of invention are suitable for a wide scope of applications, it is particularly suitable for simplifying a fabrication process, reducing a fabrication cost, and improving production yield by reducing the number of masks.

2. Description of the Related Art

As the consumer's interest in information displays is growing and the demand for portable (mobile) information devices is increasing, research and commercialization of light and thin flat panel displays ("FPD") has increased.

Among FPDs, the liquid crystal display ("LCD") is a device for displaying images by using optical anisotropy of liquid crystal. LCD devices exhibit excellent resolution and color and picture quality, so it is widely used for notebook computers or desktop monitors, and the like.

The LCD includes a color filter substrate, an array substrate and a liquid crystal layer formed between the color filter substrate and the array substrate.

An active matrix (AM) driving method commonly used for the LCD is a method in which liquid crystal molecules in a pixel part are driven by using amorphous silicon thin film transistors (a-Si TFTs) as switching elements.

In the fabricating process of the LCD, a plurality of masking processes (namely, photolithography processes) are basically performed to fabricate the array substrate including the TFTs, so a method for reducing the number of masking process will increase productivity.

A related art LCD structure will now be described in detail with reference to FIG. 1.

FIG. 1 is an exploded perspective view showing a related art LCD.

As shown in FIG. 1, the LCD includes a color filter substrate 5, an array substrate 10 and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for dividing the sub-color filters 7 and blocking light transmission through the liquid crystal layer 30, and a transparent common electrode 8 for applying voltage to the liquid crystal layer 30.

The array substrate 10 includes gate lines 16 and data lines 17 which are arranged vertically and horizontally to define a plurality of pixel regions (P), TFTs, switching elements, formed at respective crossings of the gate lines 16 and the data lines 17, and pixel electrodes 18 formed on the pixel regions (P).

The color filter substrate 5 and the array substrate 10 are attached in a facing manner by a sealant (not shown) formed at an edge of an image display region to form a liquid crystal panel, and the attachment of the color filter substrates 5 and the array substrate 10 is made by an attachment key formed on the color filter substrate 5 or the array substrate 10.

FIGS. 2a to 2e are cross-sectional views sequentially showing a fabrication process of the array substrate of the LCD in FIG. 1.

As shown in FIG. 2a, a gate electrode 21 made of a conductive material is formed by using a photolithography process (a first masking process) on a substrate.

Next, as shown in FIG. 2b, a first insulation film 15a, an amorphous silicon thin film and an n+ amorphous silicon thin film are sequentially deposited over the entire surface of the substrate 10 with the gate electrode 21 formed thereon, and the amorphous silicon thin film and the n+ amorphous silicon thin film are selectively patterned by using the photolithography process (a second masking process) to form an active pattern 24 formed of the amorphous silicon thin film on the gate electrode 21.

In this case, the n+ amorphous silicon thin film pattern 25 which has been patterned in the same form as the active pattern 24 is formed on the active pattern 24.

Thereafter, as shown in FIG. 2c, an opaque conductive film is deposited over the entire surface of the array substrate 10 and then selectively patterned by using the photolithography process (a third masking process) to form a source electrode 22 and a drain electrode 23 at an upper portion of the active pattern 24. At this time, a certain portion of the n+ amorphous silicon thin film pattern formed on the active pattern 24 is removed through the third masking process to form an ohmic-contact layer 25' between the active pattern 24 and the source and drain electrodes 22 and 23.

Subsequently, as shown in FIG. 2d, a second insulation film 15b is deposited over the entire surface of the array substrate 10 with the source electrode 22 and the drain electrode 23 formed thereon, and a portion of the second insulation film 15b is removed through the photolithography process (a fourth masking process) to form a contact hole 40 exposing a portion of the drain electrode 23.

As shown in FIG. 2e, a transparent conductive metal material is deposited over the entire surface of the array substrate 10 and then selectively patterned by using the photolithography process (a fifth making process) to form a pixel electrode 18 electrically connected with the drain electrode 23 via the contact hole 40.

As mentioned above, in fabricating the array substrate including TFTs, according to the related art, a total of five photolithography processes are necessarily performed to pattern the gate electrode, the active pattern, the source and drain electrodes, the contact hole and the pixel electrode.

A photolithography process is a process of transferring a pattern formed on a mask onto the substrate on which a thin film is deposited to form a desired pattern, which includes a plurality of processes such as a process of coating a photosensitive solution, an exposing process and a developing process, etc., which degrade the production yield.

In particular, because the masks designed for forming the pattern are quite expensive, as the number of masks used in the processes increases, the fabrication cost of the LCD increases proportionally.

SUMMARY OF THE INVENTION

Accordingly, the present invention is directed to a liquid crystal display method and fabrication method thereof that substantially obviates one or more of the problems due to limitations and disadvantages of the related art.

An advantage of the present invention is to provide a method for fabricating an LCD capable of fabricating a twisted nematic (TN) mode array substrate by performing a masking process three times.

Another advantage of the present invention is to provide a method for fabricating an LCD capable of fabricating an in-plane switching (IPS) mode array substrate by performing a masking process three times.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of embodiments of the invention, as embodied and broadly described, a method for fabricating a liquid crystal display (LCD) device includes: providing a first substrate divided into a pixel part, a data pad part and a gate pad part; forming a gate electrode and a gate line at the pixel part of the first substrate through a first masking process; forming a gate insulation film on the first substrate; forming an active pattern and source and drain electrodes and forming a data line crossing the gate line to define a pixel region at the pixel part of the first substrate through a second masking process; forming a passivation layer on the first substrate; forming a photosensitive film pattern including a first photosensitive film pattern with a first thickness and a second photosensitive film pattern with a second thickness on the passivation layer through a third masking process; selectively removing a portion of the passivation layer by using the photosensitive film pattern as a mask to form a first contact hole exposing a portion of the drain electrode; removing portions of the first and second photosensitive film patterns to remove the second photosensitive film pattern and form a third photosensitive film pattern with a third thickness; forming a transparent conductive film over the entire surface of the first substrate; removing the third photosensitive film pattern and a conductive film on the third photosensitive film pattern to form a pixel electrode electrically connected with the drain electrode via the first contact hole; and attaching the first substrate and a second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 11a to 11f are sectional views substantially showing a first masking process in FIGS. 9a and 10a.

DETAILED DESCRIPTION OF THE PREFERRED EMBODIMENTS

Reference will now be made in detail to an embodiment of the present invention, example of which is illustrated in the accompanying drawings.

Figure 1:
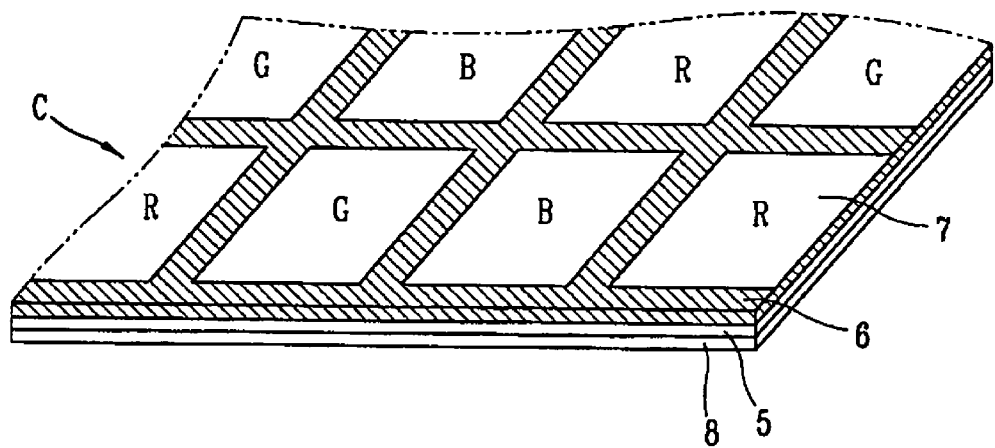
FIG. 1 is an exploded perspective view showing a related art liquid crystal display (LCD)
Figure 1:
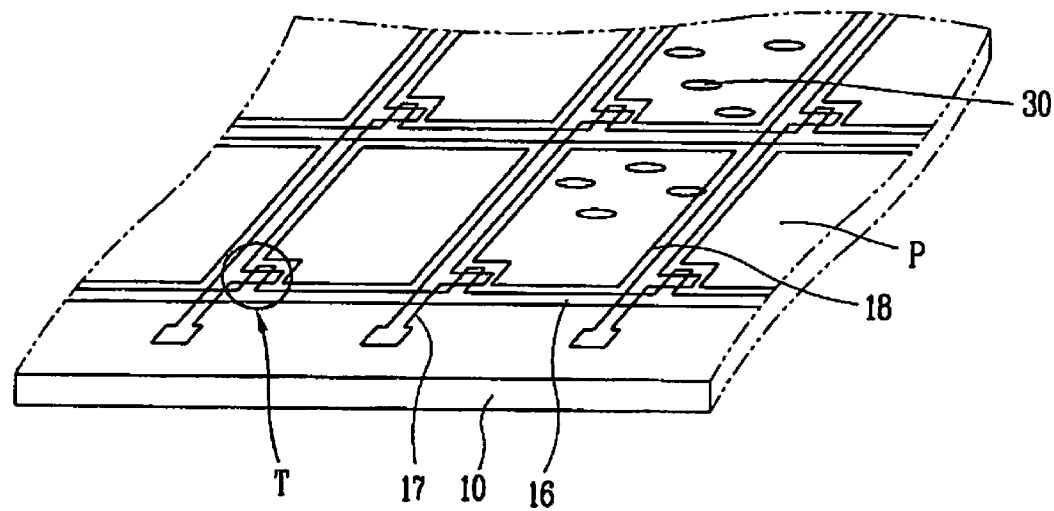
Figure 2A:
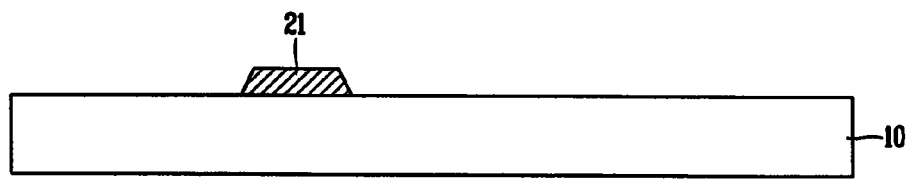
FIGS. 2a to 2e are cross-sectional views sequentially showing a fabrication process of an array substrate of the LCD in FIG. 1.
Figure 2B:
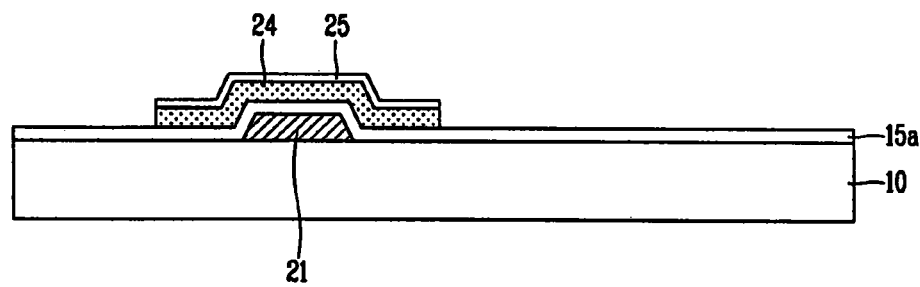
Figure 2C:
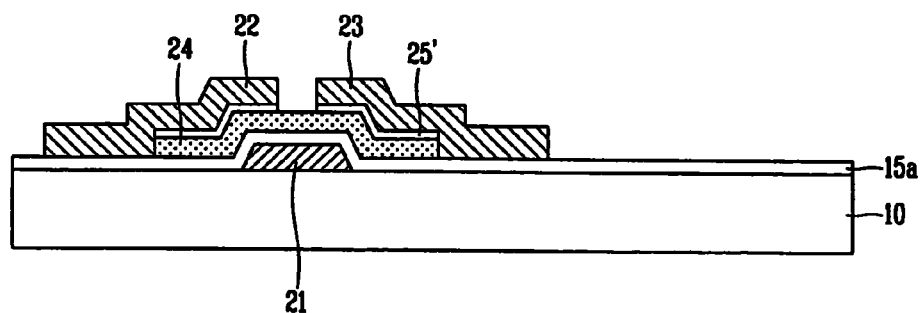
Figure 2D:
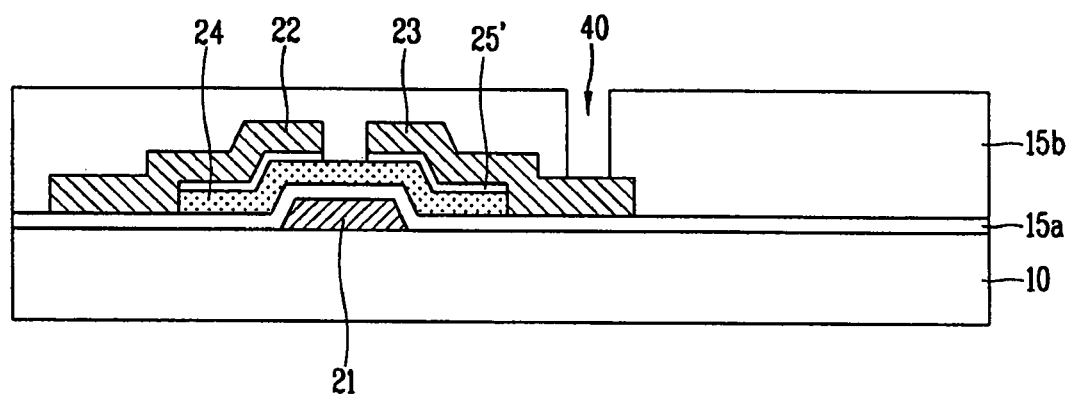
Figure 2E:
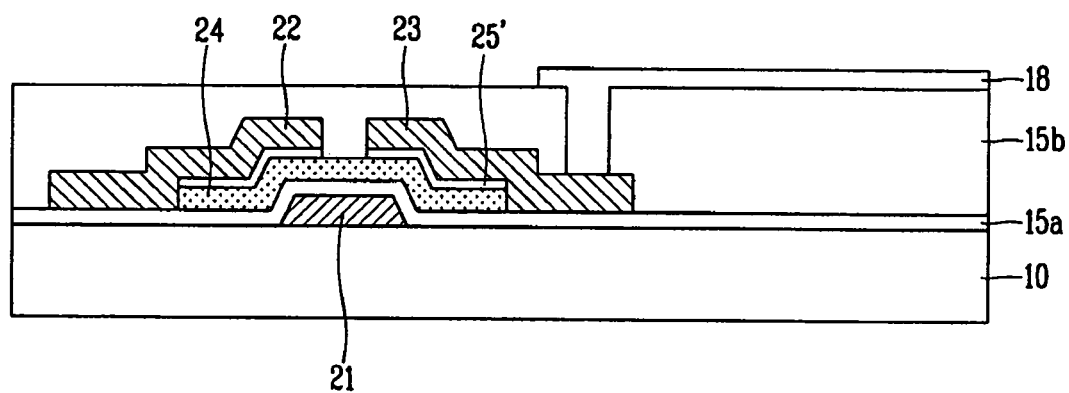
Figure 3:
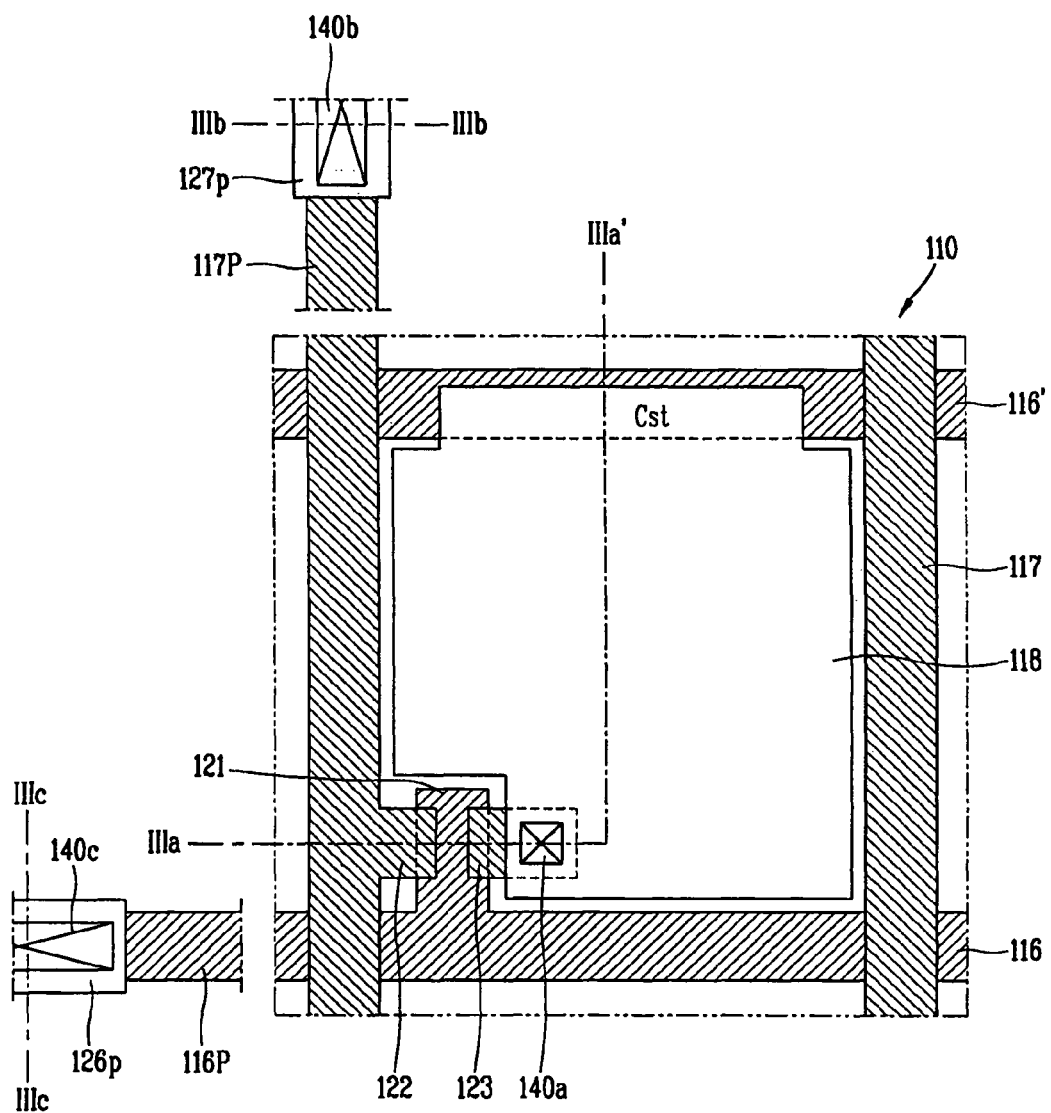
FIG. 3 is a plan view showing a portion of an array substrate of an LCD according to a first embodiment of the present invention.

FIG. 3 is a plan view showing a portion of an array substrate of an LCD according to a first embodiment of the present invention, in which a single pixel including a thin film transistor of a pixel part is shown for the sake of explanation.

Actually, the N number of gate lines and the M number of data lines are formed to cross each other to define the M×N number of pixels. To simplify the explanation, only a single pixel is shown.

As shown in FIG. 3, on an array substrate 110 according to a first embodiment of the present invention, gate lines 116 and the data lines 117 are formed to be arranged vertically and horizontally to define the pixel region. A thin film transistor (TFT), a switching element, is formed at a crossing of the gate line 116 and the data line 117. A pixel electrode 118 is formed within the pixel region, is connected with the TFT to drive liquid crystal (not shown) together with a common electrode of a color filter substrate (not shown).

The TFT includes a gate electrode 121 connected with the gate line 116, a source electrode 122 connected with the data line 117, and a drain electrode 123 connected with the pixel electrode 118. The TFT also includes an active pattern for forming a conductive channel between the source and drain electrodes 122 and 123 by a gate voltage supplied to the gate electrode 121.

A portion of the source electrode 122 extends in one direction to form a portion of the data line 117, and a portion of the drain electrode 123 extends to the pixel region to be electrically connected with the pixel electrode 118 via a first contact hole 140 formed at a passivation layer (not shown).

A portion of the previous gate line 116' overlaps with a portion of the pixel electrode 118 with a first insulation film (not shown) interposed therebetween to form a storage capacitor Cst. The storage capacitor Cst serves to uniformly maintain voltage applied to a liquid crystal capacitor until a next signal is received. Namely, the pixel electrode 118 of the array substrate 110 forms the liquid crystal capacitor together with the common electrode of the color filter substrate, and in general, voltage applied to the liquid crystal capacitor is not maintained until the next signal is received but leaked. Thus, in order to uniformly maintain the applied voltage, the storage capacitor Cst should be connected with the liquid crystal capacitor.

Besides maintaining the signal, the storage capacitor may also have the effects of stabilizing a gray scale display, reducing flickering effects, reducing the formation of residual images, and the like.

A gate pad electrode 126p and a data pad electrode 127p are formed at edge portions of the array substrate 110 and electrically connected with the gate line 116 and the data line 117, and transfer a scan signal and a data signal applied from an external driving circuit unit (not shown) to the gate line 116 and the data line 117, respectively.

Namely, the gate line 116 and the data line 117 extend to the driving circuit unit so as to be connected with the corresponding gate pad line 116p and the data pad line 117p, and the gate pad line 116p and the data pad line 117p receive the scan signal and the data signal from a driving circuit unit through the gate pad electrode 126p and the data pad electrode 127p electrically connected with the gate pad line 116p and the data pad line 117p.

The data pad electrode 127p is electrically connected with the data pad line 117p via a second contact hole 140b and the gate pad electrode 126p is electrically connected with the gate pad line 116p via a third contact hole 140c.

Herein, in the LCD according to the first embodiment of the present invention, the active pattern, the source and drain electrodes 122 and 123, and the data line 117 are formed through a single masking process by using a half-tone mask or a diffraction (slit) mask (hereinafter, it is assumed that referring to the half-tone mask means it also includes the slit (diffraction) mask), and the contact holes and the pixel electrode are simultaneously formed through a single masking process using the half-tone mask and a lift-off process. Namely, the array substrate can be fabricated through a total of three masking processes and this will be described in detail as follows.

Figure 4A:
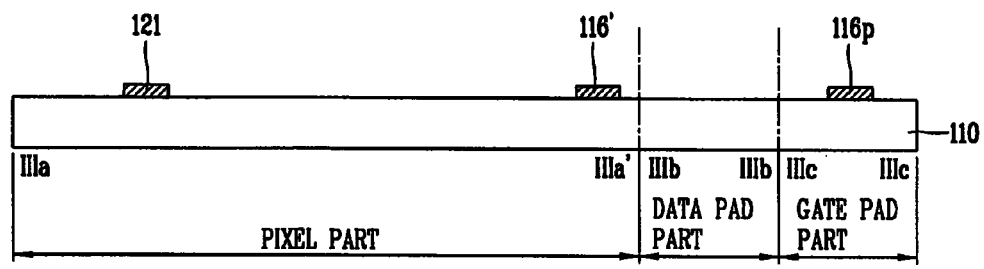
FIGS. 4a to 4c are cross-sectional views sequentially showing a fabrication process taken along lines IIIa-IIIa', IIIb-IIIb, and IIIc-IIIc of the array substrate in FIG. 3.
Figure 4B:
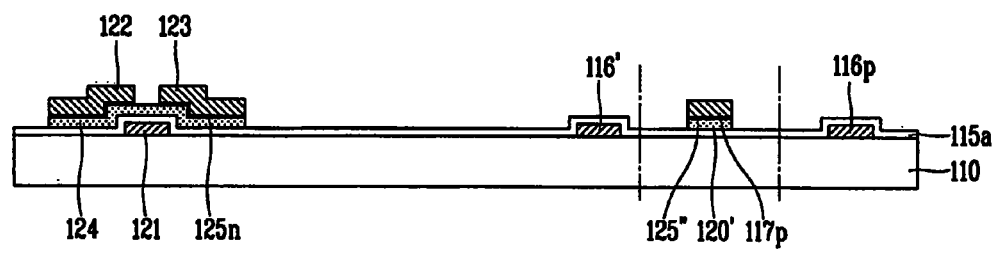
Figure 4C:
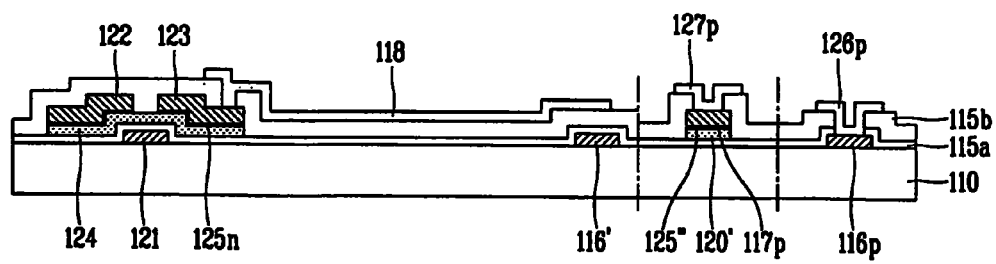

FIGS. 4a to 4c are cross-sectional views sequentially showing a fabrication process taken along lines IIIa-IIIa', IIIb-IIIb, and IIIc-IIIc of the array substrate in FIG. 3. The left side shows the process of fabricating the array substrate of the pixel part, and the right side shows the sequential process of fabricating the array substrate of the data pad part and the gate pad part.

As shown in FIG. 4a, the gate electrode 121 and the gate line 116' are formed on the pixel part of the array substrate 110 made of the transparent insulation material such as glass, and the gate pad line 116p is formed on the gate pad part of the array substrate 110.

Reference numeral 116' refers to the previous gate line with respect to a corresponding pixel, and the gate line 116' of the corresponding pixel and the previous gate line 116' are formed in the same manner.

In this case, the gate electrode 121, the gate line 116' and the gate pad line 116p are formed by depositing a first conductive film over the entire surface of the array substrate 110 and selectively patterning it through the photolithography process (a first masking process).

Herein, the first conductive film can be made of a low-resistance opaque conductive material such as aluminum (Al), an aluminum alloy, tungsten (W), copper (Cu), chromium (Cr) and molybdenum (Mo), or the like. Also, the first conductive film can be formed with a multi-layered structure by stacking two or more low-resistance conductive materials.

Next, as shown in FIG. 4b, a gate insulation film 115a, an amorphous silicon thin film, an n+ amorphous silicon thin film and a second conductive film are formed over the entire surface of the array substrate 110 with the gate electrode 121, the gate line 116' and the gate pad line 116p formed thereon, and then selectively removed through the photolithography process (a second masking process) to form an active pattern 124, which is formed of the amorphous silicon thin film, and the source and drain electrodes 122 and 123, which are formed of the second conductive film and electrically connected with the source and drain regions of the active pattern 124, at the pixel part of the array substrate 110.

Also, through the second masking process, a data pad line 117p formed of the second conductive film is formed at the data pad part of the array substrate 110.

At this time, an ohmic contact layer 125n, which is formed of the n+ amorphous silicon thin film and has been patterned in the same form as the source and drain electrodes 122 and 123, is formed on the active pattern 124.

In addition, at a lower portion of the data pad line 117p, there are formed a first amorphous silicon thin film 120' and a second n+ amorphous silicon thin film pattern 125", which are formed of the amorphous silicon thin film and the n+ amorphous silicon thin film and have been patterned in the same form as the data pad line 117p.

In the first embodiment of the present invention, the active pattern 124, the source and drain electrodes 122 and 123, and the data line (not shown) are simultaneously formed through a single masking processing (the second masking process), using a half-tone mask. The second masking process will be described in detail as follows.

FIGS. 5a to 5f are cross-cross-sectional views showing the second masking process in detail in FIG. 4b.

Figure 5A:
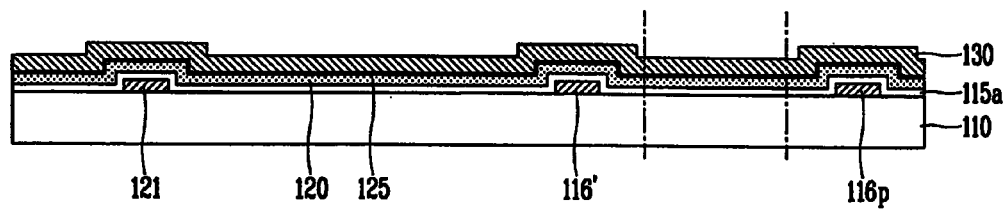
FIGS. 5a to 5f are sectional views substantially showing a second masking process in FIG. 4b.

As shown in FIG. 5a, the first insulation film 115a, the amorphous silicon thin film 120, the n+ amorphous silicon thin film 125 and the second conductive film 130 are formed over the entire surface of the array substrate 110 with the gate electrode 121, the gate line 116' and the gate pad line 116p formed thereon.

In this case, the second conductive film 130 may be made of a low-resistance opaque conductive material, such as aluminum (Al), an aluminum alloy, tungsten (W), copper (Cu), chromium (Cr), molybdenum (Mo), a molybdenum alloy, or the like, to form the source electrode, the drain electrode and the data line.

Figure 5B:
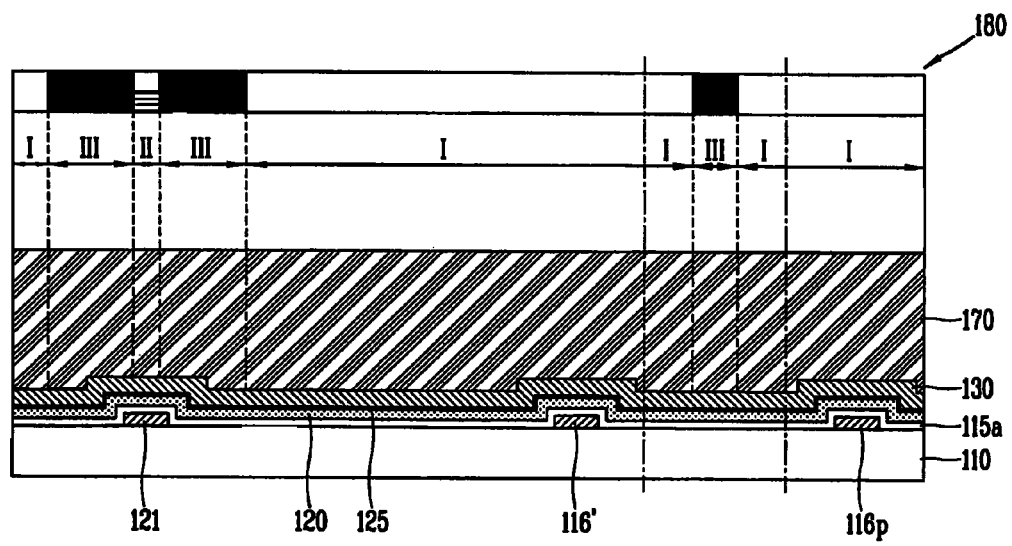

Thereafter, as shown in FIG. 5b, a first photosensitive film 170 made of a photosensitive material such as photoresist is formed over the entire surface of the array substrate 110, on which light is selectively irradiated through a first half-tone mask 180.

The first half-tone mask 180 includes a first transmission region (I) that allows irradiated light to be entirely transmitted therethrough, a second transmission region (II) that allows only light to be partially transmitted therethrough while blocking the remaining light, and a blocking region (III) that entirely blocks the irradiated light. Only light which has transmitted through the first half-tone mask 180 can be irradiated onto the first photosensitive film 170.

Figure 5C:
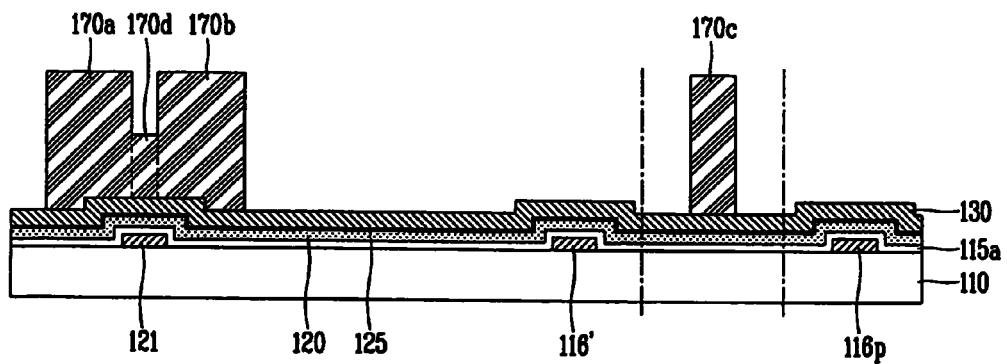

Subsequently, when the first photosensitive film 170, which has been exposed through the first half-tone mask 180, is developed, as shown in FIG. 5c, first to fourth photosensitive film patterns 170a to 170d each with a certain thickness remain at regions where light has been entirely blocked or partially blocked through the blocking region (III) and the second transmission region (II), and the first photosensitive film at the transmission region (I) through which light had been entirely transmitted has been completely removed to expose the surface of the second conductive film 130.

The first to third photosensitive film patterns 170a to 170c formed at the blocking region III are thicker than the fourth photosensitive film pattern 170d formed through the second transmission region II. In addition, the first photosensitive film at the region where the light had been entirely transmitted through the first transmission region I has been completely removed. This is because positive-type photoresist has been used. However, a negative photoresist can be also used in embodiments of the present invention.

Figure 5D:
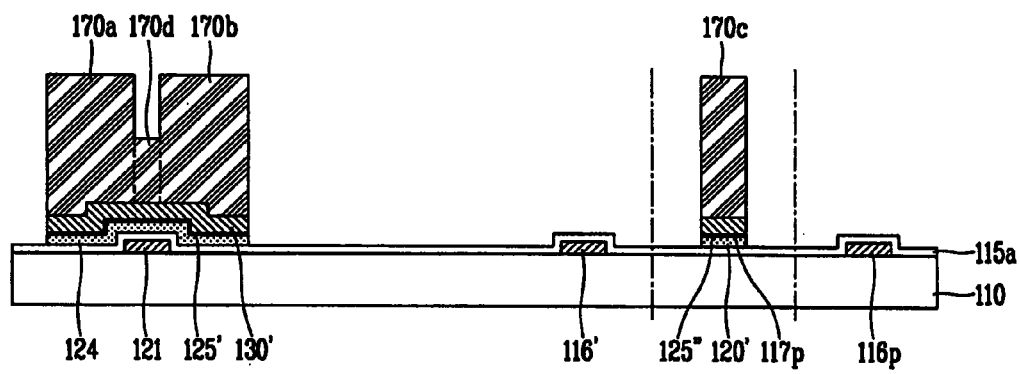

Thereafter, as shown in FIG. 5d, the amorphous silicon thin film, the n+ amorphous silicon thin film and the second conductive film are selectively removed by using the first to fourth photosensitive film patterns 170a to 170d as masks to form the active pattern 124, which is formed of the amorphous silicon thin film, at the pixel part of the array substrate 110 and the data pad line 117p, which is formed of the second conductive film, at the data pad part of the array substrate.

The first to third photosensitive film patterns 170a to 170c formed at the blocking region III are thicker than the fourth photosensitive film pattern 170d formed through the second transmission region II. In addition, the first photosensitive film at the region where the light had been entirely transmitted through the first transmission region I has been completely removed. This is because positive-type photoresist has been used. However, a negative-type photoresist can be also used in embodiments of the present invention.

Thereafter, as shown in FIG. 5d, the first insulation film 115a, the amorphous silicon thin film, the n+ amorphous silicon thin film and the second conductive film are selectively removed by using the first to fourth photosensitive film patterns 170a to 170d as masks to form the active pattern 124 formed of the amorphous silicon thin film at the pixel part of the array substrate 110 and a data pad line 117p formed of the second conductive film at the data pad part of the array substrate 110.

At this time, a first n+ amorphous silicon thin film pattern 125' and a second conductive film pattern 130', which are respectively formed of the n+ amorphous silicon thin film and the second conductive film and have been patterned in the same form as the active pattern 124, are formed at the upper portion of the active pattern 124.

In addition, a first amorphous silicon thin film pattern 120' and a second n+ amorphous silicon thin film pattern 125", which are respectively formed of the amorphous silicon thin film and the n+ amorphous silicon thin film and have been patterned in the same form as the data pad line 117p, are formed at the lower portion of the data pad line 117p.

Then, an ashing process is performed to remove portions of the first to fourth photosensitive film patterns 170a to 170d.

Figure 5E:
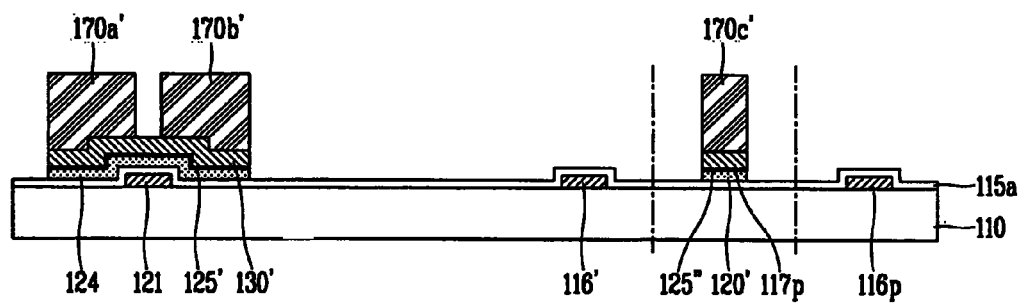

Then, as shown in FIG. 5e, the fourth photosensitive film pattern of the second transmission region II is completely removed. In this case, the first to third photosensitive film patterns remain as fifth to seventh photosensitive film patterns 170a' to 170c' by removing the thickness of the fourth photosensitive film pattern only at the source electrode region, the drain electrode region and the data pad line 117p corresponding to the blocking region III.

Figure 5F:
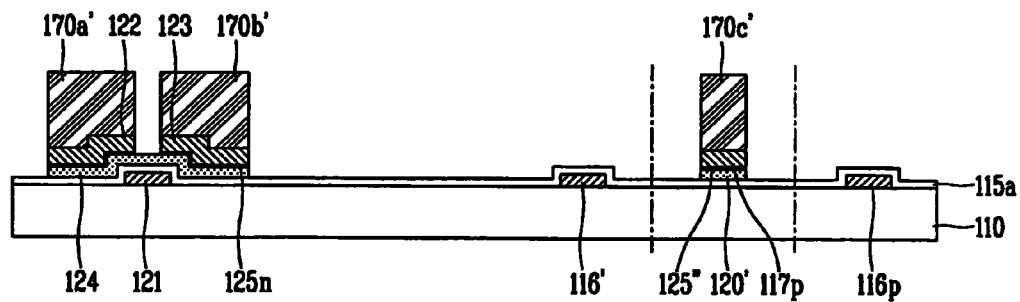

Thereafter, as shown in FIG. 5f, a portion of the second conductive film pattern is removed by using the remaining fifth to seventh photosensitive film pattern 170a' to 170c' as masks to form the source electrode 122, the drain electrode 123, and the data line formed of the second conductive film at the pixel part of the array substrate 110.

At this time, the ohmic-contact layer 125n, which is formed of the n+ amorphous silicon thin film and allows the source and drain regions of the active pattern 124 and the source and drain electrodes 122 and 123 to ohmic-contact with each other, is formed on the active pattern 124.

In the first embodiment of the present invention, the active pattern 124, the source and drain electrodes 122 and 123, and the data line are formed through the single masking process using the half-tone mask.

As shown in FIG. 4c, a passivation layer 115b is formed over the entire surface of the array substrate 110 with the active pattern 124 formed thereon, and selectively removed through the photolithography process (a third masking process) to form a first contact hole exposing a portion of the drain electrode 123 at the pixel part of the array substrate 110 and second and third contact holes exposing portions of the data pad line 117p and the gate pad line 116p at the data pad part and the gate pad part of the array substrate 110.

In this case, the pixel electrode 118, which is formed of the third conductive film and electrically connected with the drain electrode 123 via the first contact hole, is formed at the pixel part of the array substrate 110 through the third masking process.

In addition, the data pad electrode 127p and the gate pad electrode 126p, which are formed of the third conductive film and electrically connected with the data pad line 117p and the gate pad line 116p via the second and third contact holes, are formed at the data pad part and the gate pad part of the array substrate 110.

Here, through the third masking process using the half-tone mask and the lift-off process, the first to third contact holes can be formed and, at the same time, the pixel electrode 118, the data pad electrode 127p and the gate pad electrode 126p, which are electrically connected with the drain electrode 123, the data pad line 117p and the gate pad line 116p via the first to third contact holes, can be formed through the single masking process. The third masking process will now be described in detail with reference to the accompanying drawings.

FIGS. 6a to 6g are cross-sectional views substantially showing a third masking process in FIG. 4c.

Figure 6A:
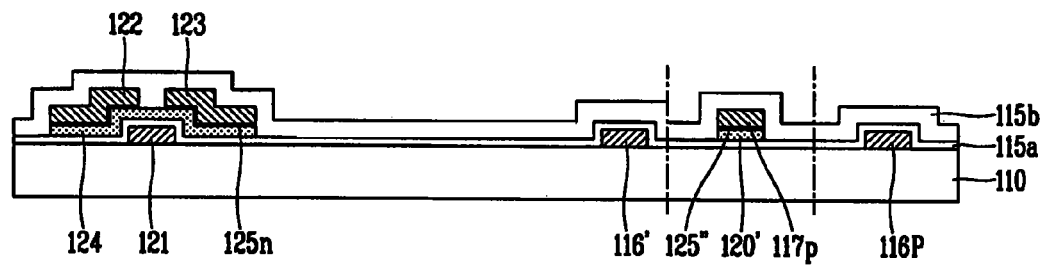
FIGS. 6a to 6g are cross-sectional views substantially showing a third masking process in FIG. 4c.

As shown in FIG. 6a, the passivation layer 115b is formed over the entire surface of the array substrate 110 with the active pattern 124, the source electrode 122 and the drain electrode 123 formed thereon.

Here, the passivation layer 115b may be formed of an inorganic insulation film such as a silicon nitride film or silicon oxide film, or may be formed of an organic insulation film such as photoacryl or benzocyclobutene (BCB).

Figure 6B:
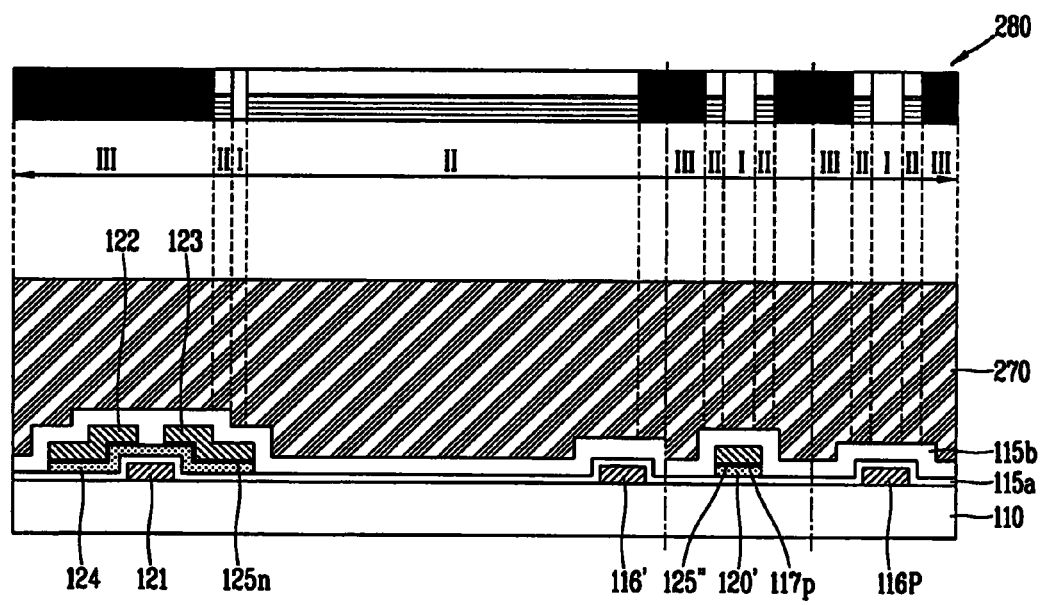

Next, as shown in FIG. 6b, a second photosensitive film 270 made of a photosensitive material such as photoresist is formed over the entire surface of the array substrate 110, on which light is selectively irradiated through a second half-tone mask 280.

The second half-tone mask 280 includes a first transmission region (I) that allows irradiated light to be entirely transmitted therethrough, a second transmission region (II) that allows only light to be partially transmitted therethrough while blocking the remaining light, and a blocking region (III) that entirely blocks the irradiated light. Only light which has transmitted through the second half-tone mask 280 can be irradiated onto the second photosensitive film 270.

Figure 6C:
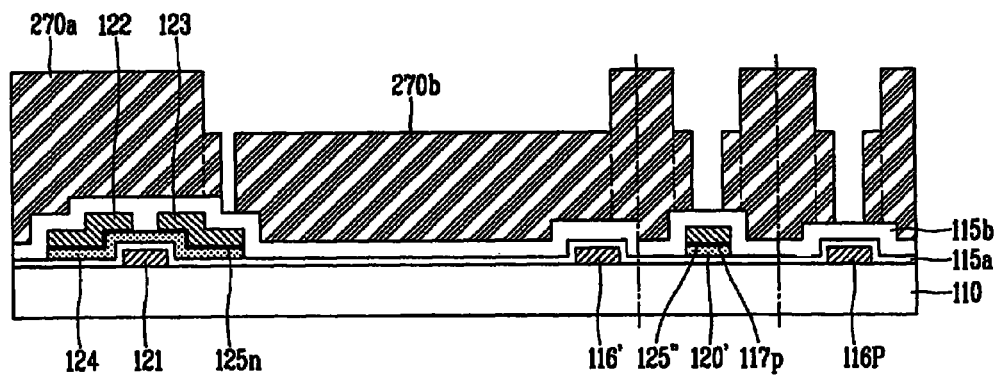

Subsequently, when the second photosensitive film 270, which has been exposed through the second half-tone mask 280, is developed, as shown in FIG. 6c, first and second photosensitive film patterns 270a and 270b each with a certain thickness remain at regions where light has been entirely blocked or partially blocked through the blocking region (III) and the second transmission region (II), and the second photosensitive film at the transmission region (I) through which light had been entirely transmitted has been completely removed to expose the surface of the passivation film 115b.

The first photosensitive film pattern 270a formed at the blocking region III is thicker than the second photosensitive film pattern 270b formed through the second transmission region II. In addition, the second photosensitive film at the region where the light had been entirely transmitted through the first transmission region I has been completely removed. This is because a positive-type photoresist has been used. However, a negative-type photoresist can be also used in embodiments of the present invention.

Figure 6D:
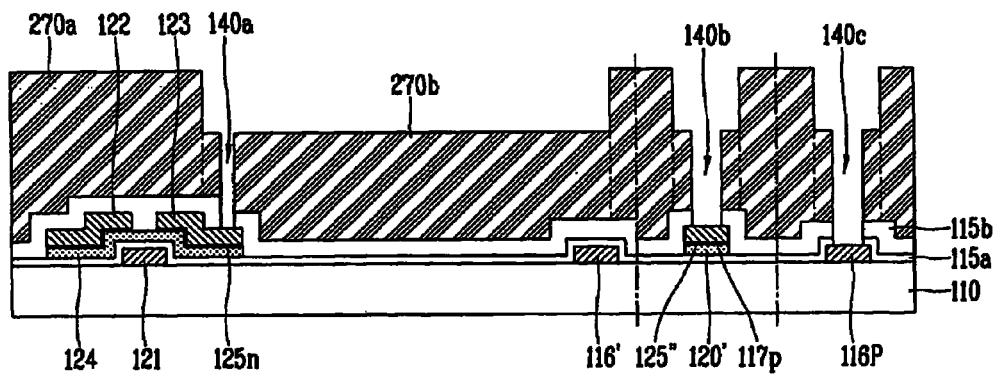

And then, as shown in FIG. 6d, a portion of the passivation layer 115b is selectively removed by using the first and second photosensitive film patterns 270a and 270b as masks to form a first contact hole 140a exposing a portion of the drain electrode 123 at the pixel part of the array substrate 110.

In addition, second and third contact holes 140b and 140c exposing portions of the data pad line 117p and the gate pad line 116p are formed at the data pad part and the gate pad part of the array substrate 110, through the third masking process.

Thereafter, the ashing process is performed to remove portions of the first and second photosensitive film patterns 270a and 270b.

Figure 6E:
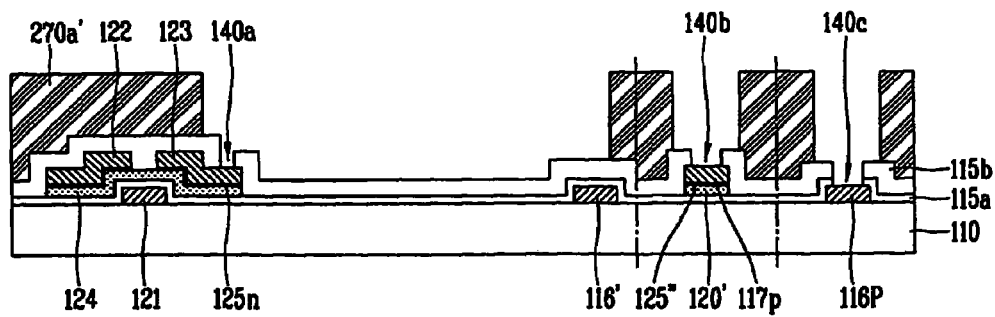

Then, as shown in FIG. 6e, the second photosensitive film pattern of the second transmission region II is completely removed. In this case, the first photosensitive film pattern remains as a third photosensitive film pattern 270a' by removing the thickness of the second photosensitive film pattern only at the region corresponding to the blocking region III. In this case, substantially, the first transmission region I and the second transmission region II, where the third photosensitive film pattern 270a' is not formed, refer to a region where a pixel electrode, a data pad electrode and a gate pad electrode are to be formed through the lift-off process (to be described).

Figure 6F:
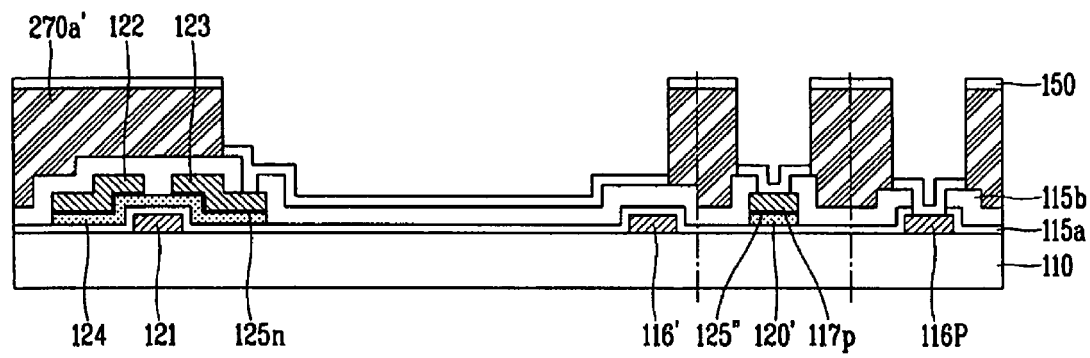

And then, as shown in FIG. 6f, a third conductive film 150 is formed over the entire surface of the array substrate 110.

The third conductive film 150 may be made of a transparent conductive material having good transmittance such as indium tin oxide (ITO) or indium zinc oxide (IZO) to form the pixel electrode, the gate pad electrode and the data pad electrode.

Here, the blocking region III where the third photosensitive film pattern 270a' remains has a certain height compared with the first transmission region I and the second transmission region II where the photosensitive film pattern 270' does not remain, so the third conductive film 150 is not formed on the side of the third photosensitive film pattern 270a'.

Figure 6G:
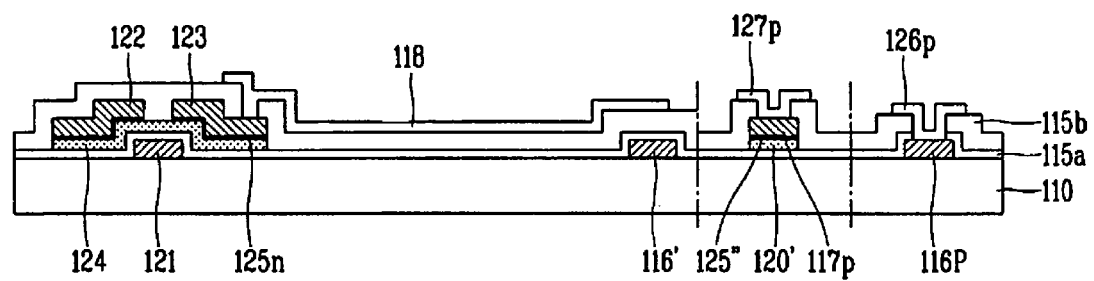

Thereafter, as shown in FIG. 6g, the third photosensitive film pattern is removed through the lift-off process, and in this case, the third photosensitive film pattern remaining at other portions than the first transmission region I and the second transmission region II and the third conductive film formed on the third photosensitive film pattern are removed together.

Here, the third conductive film remaining at the first and second transmission regions I and II, namely, at the interior of the first to third contact holes and on the passivation layer 115b forms the pixel electrode 118 which is electrically connected with the drain electrode 123 via the first contact hole and, at the same time, forms the data pad electrode 127p and the gate pad electrode 126p which are electrically connected with the data pad line 117p and the gate pad line 116p via the second and third contact holes, respectively.

The lift-off process is a process in which the conductive metallic material such as the third conductive film is deposited with a certain thickness on the photosensitive material such as the third photosensitive film pattern and then precipitated in a solution such as a stripper to remove the photosensitive material with the metallic material deposited thereon together with the metallic material. In this case, the metallic material formed within the first to third contact holes and on the passivation film 115b remains, rather than being removed, to form the pixel electrode 118, the data pad electrode 127p and the gate pad electrode 126p.

At this time, a portion of the corresponding pixel electrode 118 overlaps with a portion of the previous gate line 116' to form a storage capacitor together with the previous gate line 116' with the lower gate insulation film 115a and the passivation layer 115b interposed therebetween.

Here, the LCD according to the first embodiment of the present invention is, for example, a twisted nematic (TN) mode LCD in which liquid nematic crystal molecules are driven in a direction perpendicular to the substrate. However, the TN mode LCD has shortcomings that its viewing angle is narrow, namely, about 90°. This results from a refractive anisotropy of the liquid crystal molecules. That is, when voltage is applied to a liquid crystal panel, liquid crystal molecules aligned to be parallel to the substrate become aligned to be substantially perpendicular to the substrate.

An in-plane switching (IPS) mode LCD improves the viewing angle by more than 170° by driving the liquid crystal molecules in a direction horizontal to the substrate. The IPS mode LCD according to the second and third embodiments of the present invention will now be described.

Figure 7:
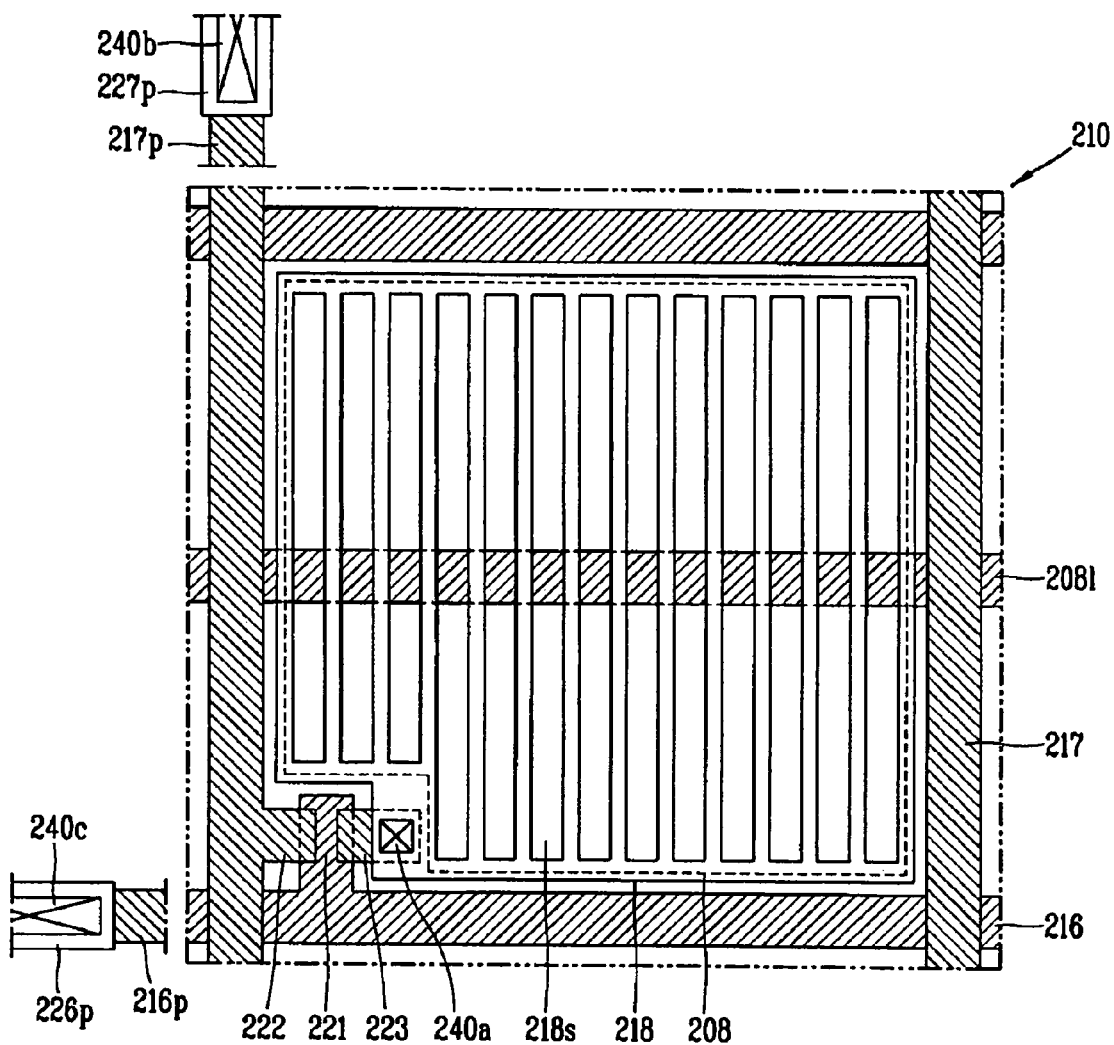
FIG. 7 is a plan view showing a portion of an array substrate of an LCD according to a second embodiment of the present invention.

FIG. 7 is a plan view showing a portion of an array substrate of an IPS mode LCD according to a second embodiment of the present invention.

As shown in FIG. 7, on an array substrate 210 of the IPS mode LCD according to the second embodiment of the present invention, there are formed a gate line 216 and a data line 217 which are arranged vertically and horizontally to define a pixel region. A thin film transistor (TFT), a switching element, is formed at a crossing of the gate line 216 and the data line 217. A common electrode 208 and a pixel electrode 218 having multiple slits 218s are formed in the pixel region and drive liquid crystal (not shown) by generating an in-plane field.

As the IPS mode LCD according to the second embodiment of the present invention, a fringe field switching (FFS) mode LCD that drives liquid crystal molecules by generating a fringe field, a parabolic in-plane field, in a liquid crystal layer is shown as an example and the intervals between the pixel electrodes 218 are narrow compared with the width of the pixel electrode 218.

On the array substrate 210 of the FFS mode LCD, the common electrode 208 is formed in a box shape, and the pixel electrode 218 is formed to have the multiple slits 218s with the common electrode 208, a gate insulation film (not shown) and a passivation layer (not shown) interposed therebetween.

The TFT includes a gate electrode 221 connected with the gate line 216, a source electrode 222 connected with the data line 217, and a drain electrode 223 electrically connected with pixel electrode 218. The TFT also includes an active pattern (not shown) that forms a conductive channel between the source electrode 222 and the drain electrode 223 by a gate voltage supplied to the gate electrode 221.

A portion of the source electrode 222 extends in one direction to form a portion of the data line 217, and a portion of the drain electrode 223 extends toward the pixel region so as to be electrically connected with the pixel electrode 218 via a first contact hole 240a formed at the passivation layer.

As mentioned above, the common electrode 208 and the pixel electrode 218 having multiple slits 218s that generate an in-plane field are formed within the pixel region.

The common electrode 208 is connected with a common line 208l disposed to be parallel to the gate line 216, and the common electrode 208a and the common line 208l are formed through a single masking process using a half-tone mask.

The common line 208l is made of the same opaque conductive material as that of the gate line 216, and the common electrode 208 may be made of the transparent conductive material as that of the pixel electrode 218.

A gate pad electrode 226p and a data pad electrode 227p electrically connected with the gate line 216 and the data line 217, respectively, are formed at edges of the array substrate 210, and transfer a scan signal and a data signal received from an external driving circuit unit (not shown) to the gate line 216 and the data line 217.

Namely, the gate line 216 and the data line 217 extend toward the driving circuit unit so as to be connected with the corresponding gate pad line 216p and the data pad line 217p. The gate pad line 216p and the data pad line 217p receive the scan signal and the data signal from the driving circuit unit via the gate pad electrode 226p and the data pad electrode 227p electrically connected with the gate pad line 216p and the data pad line 217p, respectively.

Reference numerals 240b and 240c denote second and third contact holes. The data pad electrode 227p is electrically connected with the data pad line 217p via the second contact hole 240b, and the gate pad electrode 226p is electrically connected with the gate pad line 216p via the third contact hole 240c.

Because the slits of the pixel electrode having a certain angle are formed to be symmetrical to each other based on the common line, the liquid crystal molecules are arranged in two directions, forming two domains, so the viewing angle can be improved compared with a mono-domain. In addition, with the multi-domain structure in which the liquid crystal molecules have symmetrical driving directions, abnormal light due to birefringence characteristics of liquid crystal can be canceled out to minimize a color shift phenomenon. This will now be described through the third embodiment of the present invention.

Figure 8:
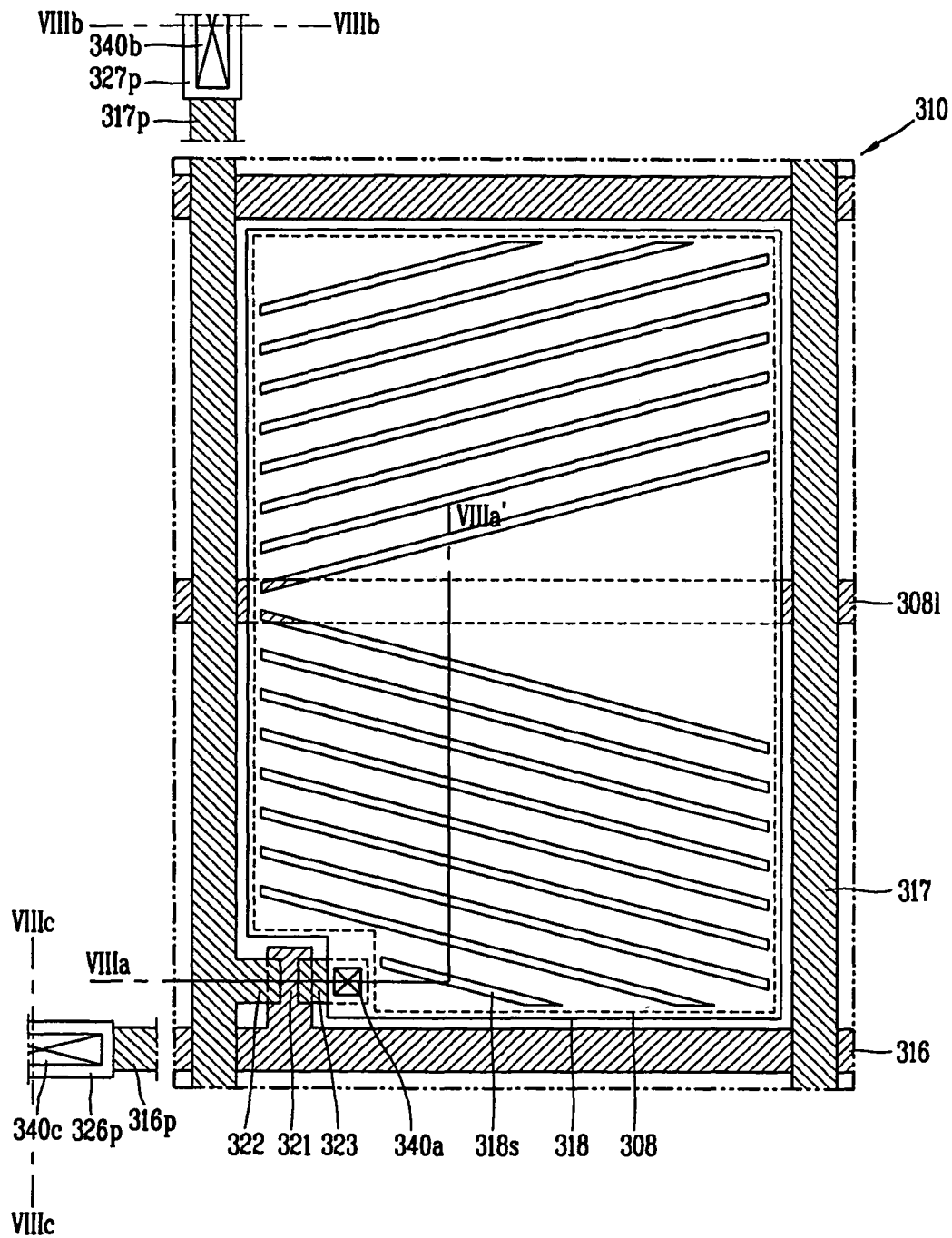
FIG. 8 is a plan view showing a portion of an array substrate of an LCD according to a third embodiment of the present invention.

FIG. 8 is a plan view showing a portion of an array substrate of an LCD according to a third embodiment of the present invention, which has the same structure as that of the array substrate in the second embodiment of the present invention, except that the slits of the pixel electrode having a certain angle are symmetrical to each other based on the common line.

Namely, as shown in FIG. 8, the array substrate according to the third embodiment of the present invention, on an array substrate 310 of the FFS mode LCD according to the third embodiment of the present invention, there are formed a gate line 316 and a data line 317 which are arranged vertically and horizontally to define a pixel region. A thin film transistor (TFT), a switching element, is formed at a crossing of the gate line 316 and the data line 317. A common electrode 308 and a pixel electrode 318 having multiple slits 318s are formed in the pixel region and drive liquid crystal (not shown) by generating an in-plane field.

On the array substrate 310 of the FFS mode LCD according to the third embodiment of the present invention, the common electrode 308 may be formed in a box shape and the pixel electrode 318 may have multiple slits 318s with the common electrode 308 with a gate insulation film (not shown) and a passivation layer (not shown).

The TFT includes a gate electrode 321 connected with the gate line 316, a source electrode 222 connected with the data line 317, and a drain electrode 323 electrically connected with pixel electrode 318. Also, the TFT includes an active pattern (not shown) that forms a conductive channel between the source electrode 322 and the drain electrode 323 by a gate voltage supplied to the gate electrode 321.

A portion of the source electrode 322 extends in one direction to form a portion of the data line 317, and a portion of the drain electrode 323 extends toward the pixel region so as to be electrically connected with the pixel electrode 318 via a first contact hole 340a formed at the passivation layer.

As mentioned above, the common electrode 308 and the pixel electrode 318 having multiple slits 318s that generate an in-plane field are formed within the pixel region.

The common electrode 308 is connected with a common line 308l disposed to be parallel to the gate line 316, and the common electrode 308a and the common line 308l are formed through a single masking process using a half-tone mask.

The common line 308l is made of the same opaque conductive material as that of the gate line 316, and the common electrode 308 may be made of the transparent conductive material as that of the pixel electrode 318.

A gate pad electrode 326p and a data pad electrode 327p electrically connected with the gate line 316 and the data line 317, respectively, are formed at edges of the array substrate 310, and transfer a scan signal and a data signal received from an external driving circuit unit (not shown) to the gate line 316 and the data line 317.

Namely, the gate line 316 and the data line 317 extend toward the driving circuit unit so as to be connected with the corresponding gate pad line 316p and the data pad line 317p. The gate pad line 316p and the data pad line 317p receive the scan signal and the data signal from the driving circuit unit via the gate pad electrode 326p and the data pad electrode 327p electrically connected with the gate pad line 316p and the data pad line 317p, respectively.

Reference numerals 340b and 340c denote second and third contact holes. The data pad electrode 327p is electrically connected with the data pad line 317p via the second contact hole 340b, and the gate pad electrode 326p is electrically connected with the gate pad line 316p via the third contact hole 340c.

In this case, as mentioned above, the common electrode 308 and the pixel electrode 318 are formed on a unit pixel region of the array substrate 310 to form a fringe field. The fringe field is a parabolic field which operates all the liquid crystal molecules at an upper portion of the pixel electrode 218 such that the longer axes of the liquid crystal molecules are twisted along the field. Thus, the user can view the longer axes of the liquid crystal molecules in any direction, so the viewing angle of the LCD can be improved.

In the LCD according to the third embodiment of the present invention, because the slits 318s of the pixel electrode 318 are symmetrical to each other with a certain tilt based on the common line 308l, the liquid crystal molecules are arranged in two directions, forming two domains, so the viewing angle can be improved compared with a mono-domain.

The array substrate of the LCD according to the second and third embodiments of the present invention can be fabricated by performing a total of three masking processes. That is, the gate electrode, the common electrode and the common line are formed through a single masking process (a first masking process) using the half-tone mask; the active pattern, the source and drain electrodes, and the data line are formed through a single masking process (a second masking process); the contact holes and the pixel electrode are simultaneously formed through a single masking process (a third masking process) using the half-tone mask and the lift-off process. This will now be described in detail through the fabrication method of the LCD.

Figure 9A:
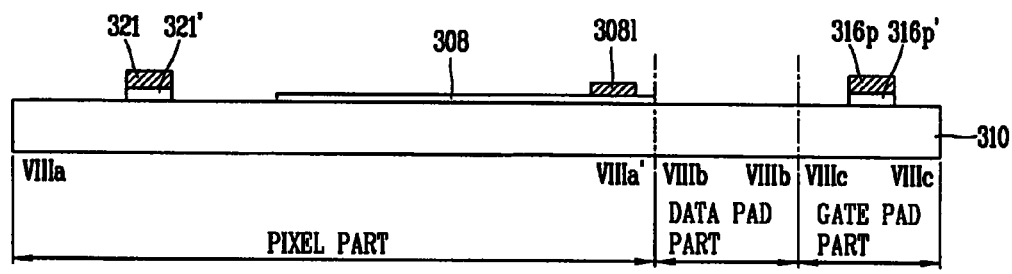
FIGS. 9a to 9c are cross-sectional views sequentially showing a fabrication process taken along lines VIIIa-VIIIa', VIIIb-VIIIb, and VIIIc-VIIIc of the array substrate in FIG. 8.
Figure 9B:
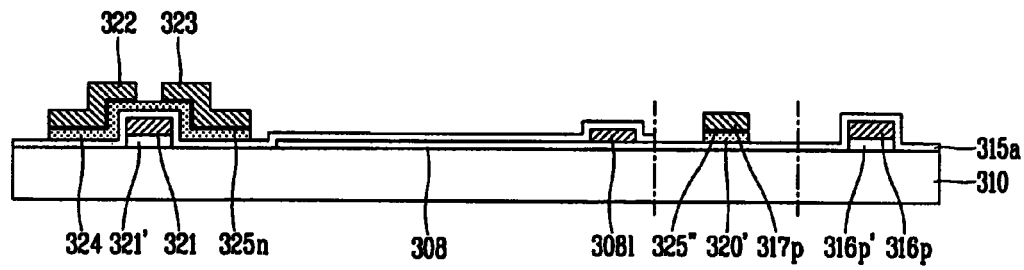
Figure 9C:
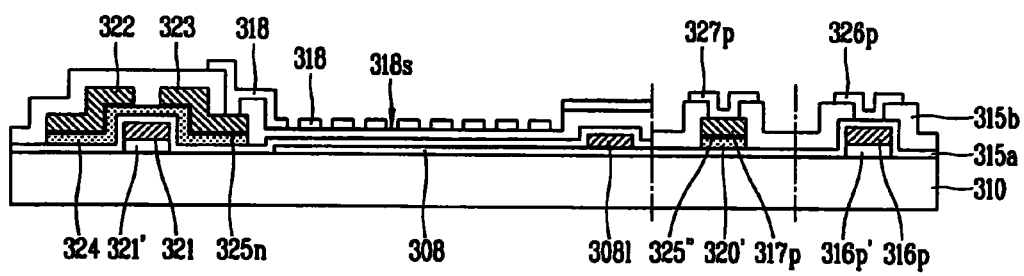

FIGS. 9a to 9c are cross-sectional views sequentially showing a fabrication process taken along lines VIIIa-VIIIa', VIIIb-VIIIb, and VIIIc-VIIIc of the array substrate in FIG. 8, in which the left side shows the process of fabricating the array substrate of the pixel part and the right side shows the sequential process of fabricating the array substrate of the data pad part and the gate pad part.

Figure 10A:
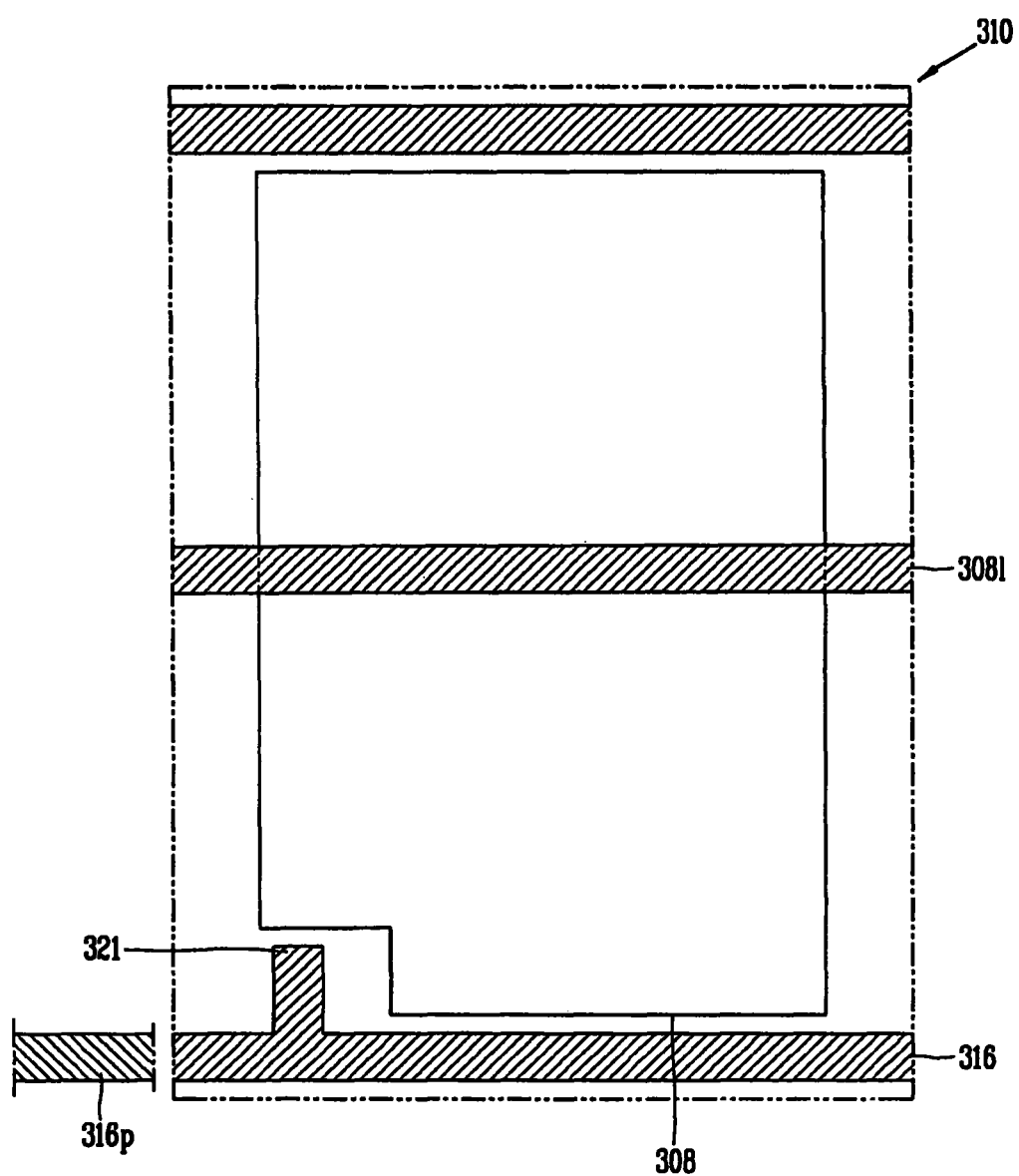
FIGS. 10a to 10c are plan views sequentially showing a fabrication process of the array substrate in FIG. 8.
Figure 10B:
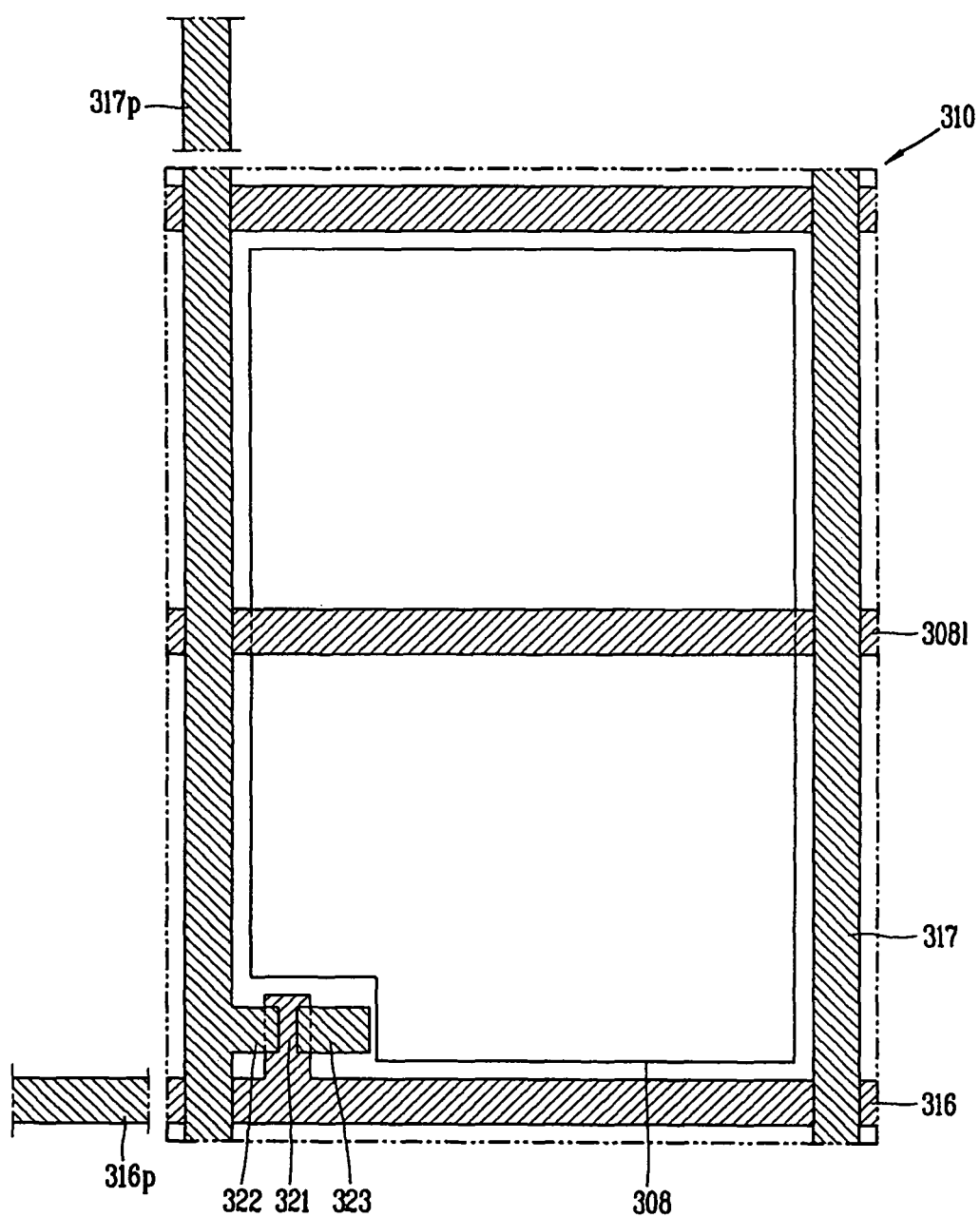
Figure 10C:
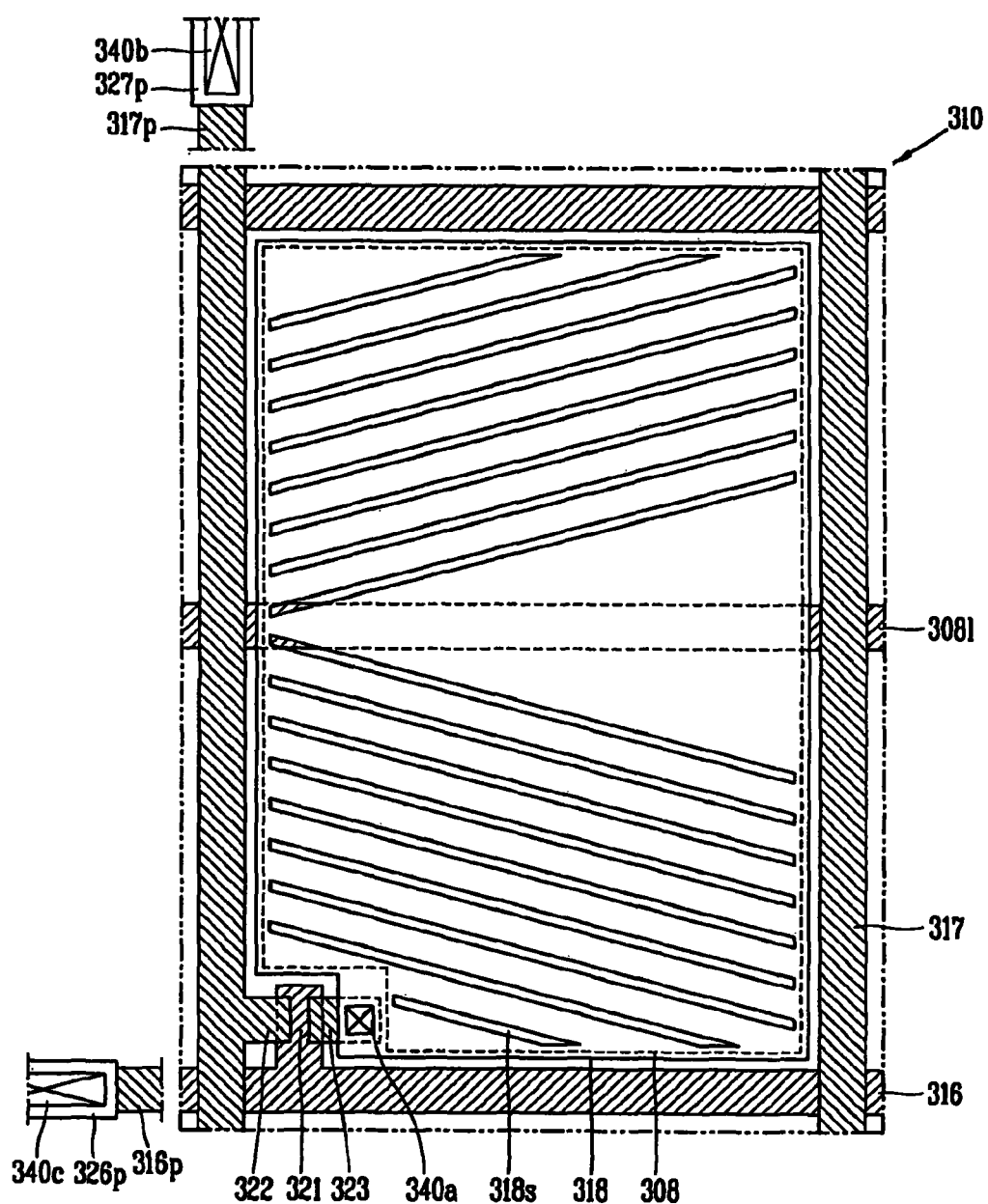

FIGS. 10a to 10c are plan views sequentially showing a fabrication process of the array substrate in FIG. 8.

As shown in FIGS. 9a and 10a, the gate electrode 321 and the gate line 316 are formed on the pixel part of the array substrate 310 made of a transparent insulation material such as glass, and the gate pad line 316p is formed on the gate pad part of the array substrate 110.

In addition, the box-shaped common electrode 308 is formed at the pixel part of the array substrate 210 and, at the same time, the common line 308I electrically connected with the common line 308I is formed.

In this case, the gate electrode 321, the gate line 316, the gate pad line 316p, the common electrode 308, and the common line 308I are formed by depositing first and second conductive films over the entire surface of the array substrate 310 and then selectively patterning them through a photolithography process (the first masking process).

Here, the first conductive film may be made of a transparent conductive material with good transmittance such as indium-tin-oxide (ITO) or indium-zinc-oxide (IZO).

The second conductive film may be made of a low-resistance opaque conductive material such as aluminum (Al), an aluminum alloy, tungsten (W), copper (Cu), chromium (Cr) and molybdenum (Mo), or the like. Also, the second conductive film can be formed with a multi-layered structure by stacking two or more low-resistance conductive materials.

In the LCD according to the third embodiment of the present invention, the common line 308I may be formed of the transparent first conductive film through a single masking process using the half-tone mask, and the gate electrode 321, the gate line 316, the gate pad line 316p, and the common electrode 308 can be formed of the opaque second conductive film. The first masking process will now be described in detail with reference to the accompanying drawings.

FIGS. 11a to 11f are sectional views substantially showing a first masking process in FIGS. 9a and 10a.

Figure 11A:
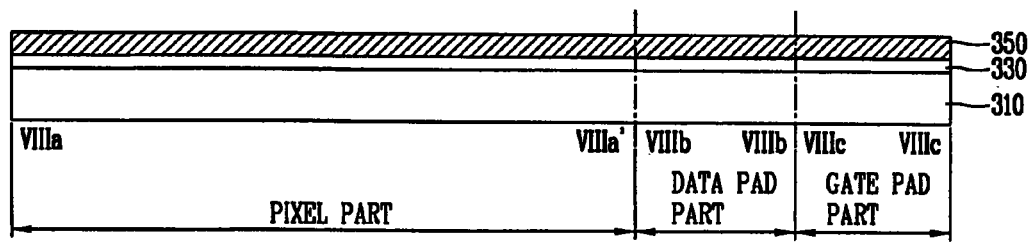

As shown in FIG. 11a, a first conductive film 330 and a second conductive film 350 are formed over the entire surface of the array substrate 310 made of a transparent insulation material.

The first conductive film may be made of a transparent conductive material with good transmittance such as indium-tin-oxide (ITO) or indium-zinc-oxide (IZO) in order to form the common line.

The second conductive film may be made of a low-resistance opaque conductive material such as aluminum (Al), an aluminum alloy, tungsten (W), copper (Cu), chromium (Cr) and molybdenum (Mo), or the like, in order to form the gate electrode, the gate line, the gate pad line, and the common line. Also, the second conductive film can be formed with a multi-layered structure by stacking two or more low-resistance conductive materials.

Figure 11B:
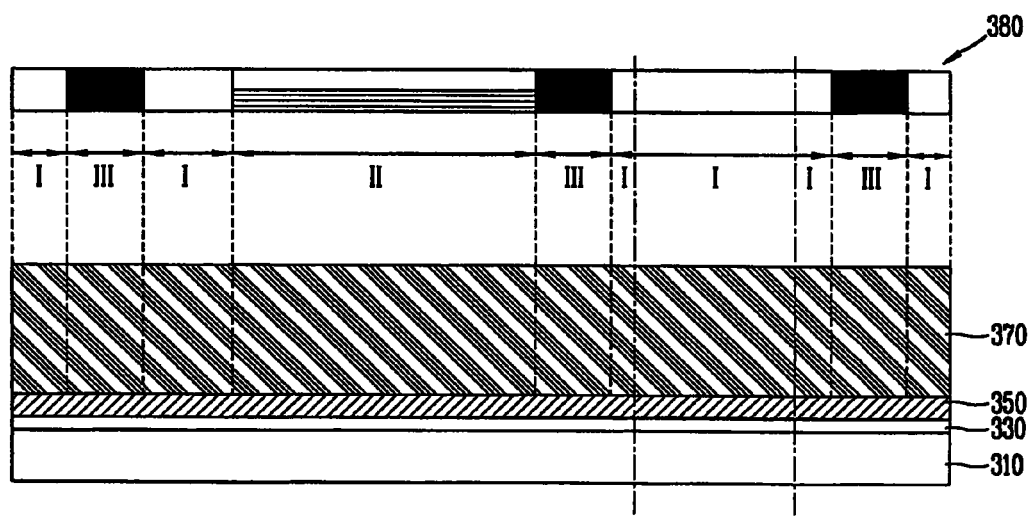

As shown in FIG. 11b, a first photosensitive film 370 made of a photosensitive material such as photoresist is formed over the entire surface of the array substrate 310, on which light is selectively irradiated through a first half-tone mask 380.

The first half-tone mask 380 includes a first transmission region (I) that allows irradiated light to be entirely transmitted therethrough, a second transmission region (II) that allows only light to be partially transmitted therethrough while blocking the remaining light, and a blocking region (III) that entirely blocks the irradiated light. Only light which has been transmitted through the first half-tone mask 180 can be irradiated onto the first photosensitive film 370.

Figure 11C:
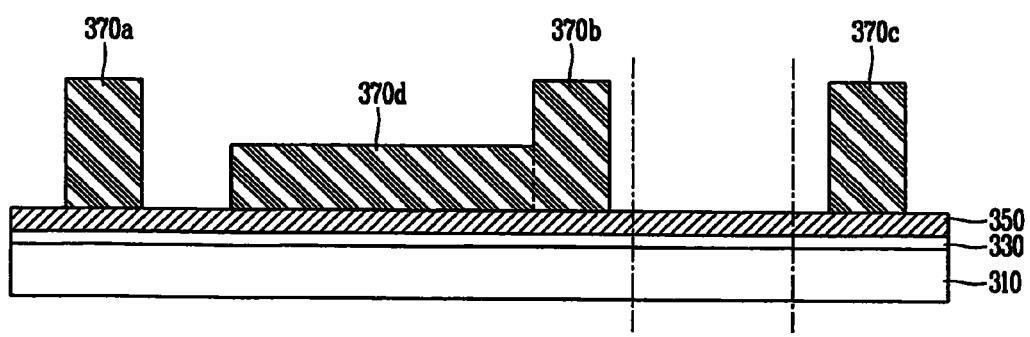

Subsequently, when the first photosensitive film 370, which has been exposed through the first half-tone mask 380, is developed, as shown in FIG. 11c, first to fourth photosensitive film patterns 370a to 370d each with a certain thickness remain at regions where light has been entirely blocked or partially blocked through the blocking region (III) and the second transmission region (II), and the first photosensitive film at the transmission region (I) through which light had been entirely transmitted has been completely removed to expose the surface of the second conductive film 350.

The first to third photosensitive film patterns 370a to 370c formed at the blocking region III are thicker than the fourth photosensitive film pattern 370d formed through the second transmission region II. In addition, the photosensitive film at the region where the light had been entirely transmitted through the first transmission region I has been completely removed. This is because a positive-type photoresist has been used. However, a negative-type photoresist can be also used in embodiments of the present invention.

Figure 11D:
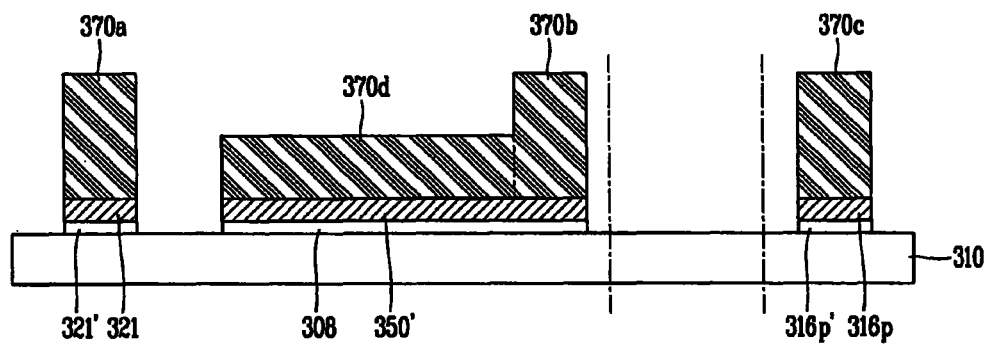

Thereafter, as shown in FIG. 11d, the lower first and second conductive films are selectively removed by using the first to fourth photosensitive film patterns 370a to 370d as masks to form the common electrode 308, which is formed of the first conductive film, and the gate electrode and the gate line (not shown), which are formed of the second conductive film, at the pixel part of the array substrate 310.

Also, the gate pad line 316p, which is formed of the second conductive film, is formed at the data pad part of the array substrate 310.

At this time, a second conductive film pattern 350', which is formed of the second conductive film and has been patterned in the same form as the common electrode 308, is formed on the common electrode 308.

In addition, a gate electrode pattern 321' and a gate pad line pattern 316p', which are formed of the first conductive film and have been patterned in the same form as the gate electrode 321 and the gate pad line 316p beneath the gate electrode 321 and the gate pad line 316p.

Thereafter, an ashing process is performed to remove portions of the first to fourth photosensitive film patterns 370a to 370d.

Figure 11E:
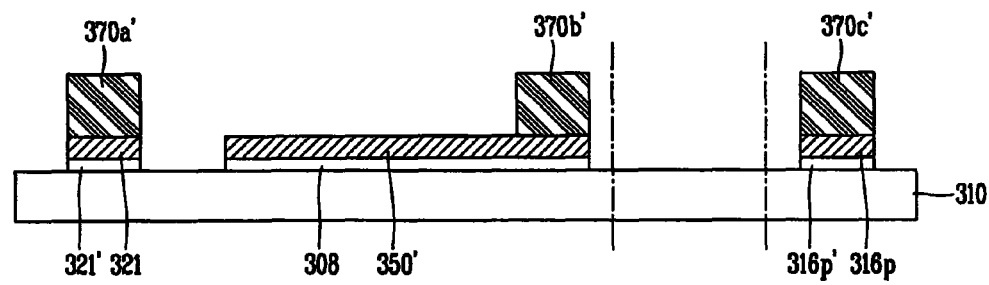

Then, as shown in FIG. 11e, the fourth photosensitive film pattern at the second transmission region II is completely removed. In this case, the first to third photosensitive film patterns remain as fifth to seventh photosensitive film patterns 370a' to 370c' by removing the thickness of the fourth photosensitive film pattern only on the gate electrode 321, the common line region, and the gate pad line 316p corresponding to the blocking region III.

Figure 11F:
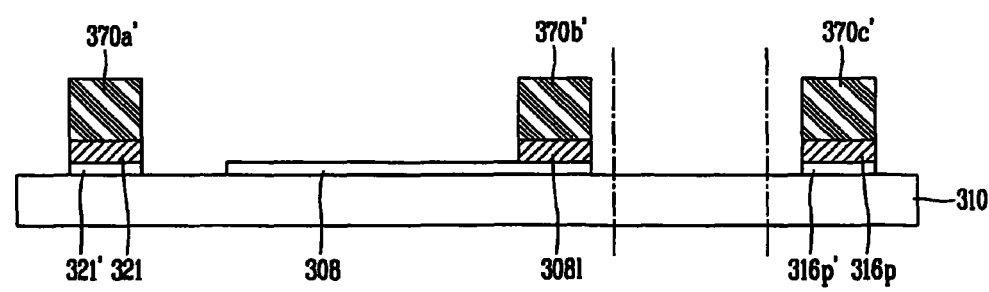

Thereafter, as shown in FIG. 11f, a portion of the second conductive film pattern is removed by using the remaining fifth to seventh photosensitive film patterns 370a' to 370c' to form the common line 308I, which is formed of the second conductive film, at the pixel part of the array substrate 310.

In this case, the common line 308I is directly electrically connected with the lower common electrode 308.

In the third embodiment of the present invention, the gate electrode 321, the gate line, the gate pad line 316p, the common electrode 308, and the common line 308I can be formed through the single masking process using the half-tone mask.

Next, as shown in FIGS. 9b and 10b, a gate insulation film 315a, an amorphous silicon thin film, an n+ amorphous silicon thin film and a third conductive film are formed over the entire surface of the array substrate 310 with the gate electrode 321, the gate line 316, the gate pad line 316p, the common electrode 308, and the common line 308I formed thereon, and then selectively removed through the photolithography process (a second masking process) to form an active pattern 324, which is formed of the amorphous silicon thin film, and the source and drain electrodes 322 and 323, which are formed of the third conductive film and electrically connected with the source and drain regions of the active pattern 324, at the pixel part of the array substrate 310.

Also, through the second masking process, a data pad line 317p, which is formed of the third conductive film, is formed at the data pad part of the array substrate 310.

At this time, an ohmic contact layer 325n, which is formed of the n+ amorphous silicon thin film and has been patterned in the same form as the source and drain electrodes 322 and 323, is formed on the active pattern 324.

In addition, at a lower portion of the data pad line 317p, there are formed a first amorphous silicon thin film 320' and a second n+ amorphous silicon thin film pattern 325", which are formed of the amorphous silicon thin film and the n+ amorphous silicon thin film and have been patterned in the same form as the data pad line 317p.

Likewise as in the first embodiment of the present invention. In the third embodiment of the present invention, the active pattern 324, the source and drain electrodes 322 and 323, and the data line (not shown) can be simultaneously formed through a single masking processing (the second masking process) using the half-tone mask.

And then, as shown in FIGS. 9c and 10c, a passivation layer 315b is formed over the entire surface of the array substrate 310 with the active pattern 324 formed thereon, and selectively removed through the photolithography process (a third masking process) to form a first contact hole 340a exposing a portion of the drain electrode 323 at the pixel part of the array substrate 110 and second and third contact holes 340b and 340c exposing portions of the data pad line 317p and the gate pad line 316p at the data pad part and the gate pad part of the array substrate 310.

In this case, the pixel electrode 318, which is formed of a fourth conductive film and electrically connected with the drain electrode 323 via the first contact hole 340a, is formed at the pixel part of the array substrate 310 through the third masking process.

In addition, the data pad electrode 327p and the gate pad electrode 326p, which are formed of the fourth conductive film and electrically connected with the data pad line 317p and the gate pad line 316p via the second and third contact holes 340b and 340c, are formed at the data pad part and the gate pad part of the array substrate 310.

In this case, in the third embodiment of the present invention, the pixel electrode 318 has a box-like structure with multiple slits 318s which are symmetrical to each other with a certain tilt based on the common line 308I, so the liquid crystal molecules are arranged in two directions, forming two domains, and thus, the viewing angle can be improved compared with a mono-domain.

Here, through the third masking process using the half-tone mask and the lift-off process, the first to third contact holes 340a to 340c can be formed and, at the same time, the pixel electrode 318, the data pad electrode 327p and the gate pad electrode 326p, which are electrically connected with the drain electrode 323, the data pad line 317p and the gate pad line 316p via the first to third contact holes 340a to 340c, can be formed through the single masking process. The third masking process will now be described in detail with reference to the accompanying drawings.

FIGS. 12a to 12g are sectional views substantially showing a third masking process in FIGS. 9c and 10c.

Figure 12A:
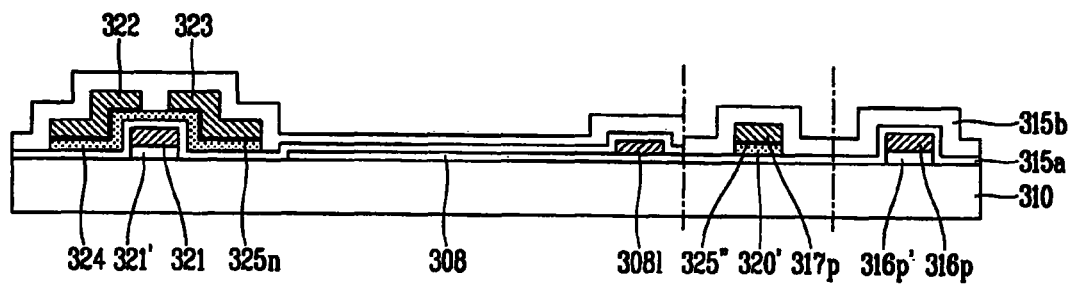
FIGS. 12a to 12g are sectional views substantially showing a third masking process in FIGS. 9c and 10c.
Figure 12B:
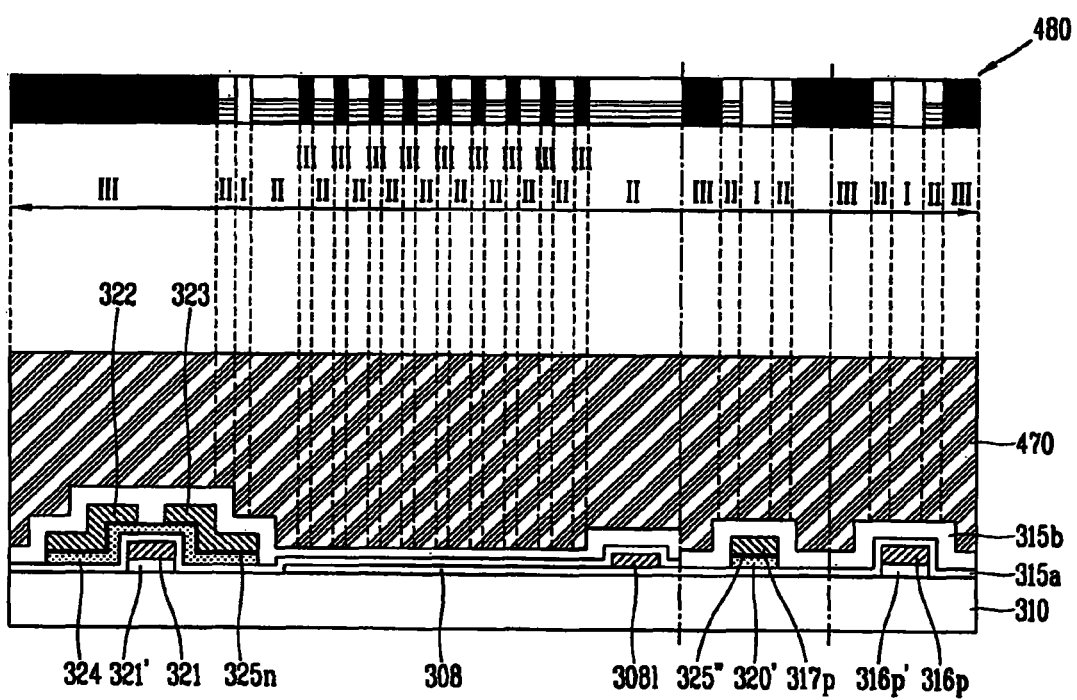

As shown in FIG. 12a, the passivation layer 315b is formed over the entire surface of the array substrate 310 with the active pattern 324, the source electrode 322 and the drain electrode 323 formed thereon.

Here, the passivation layer 315b may be formed of an inorganic insulation film such as a silicon nitride film or silicon oxide film, or may be formed of an organic insulation film such as photoacryl or benzocyclobutene (BCB).

Next, as shown in FIG. 6b, a second photosensitive film 470 made of a photosensitive material such as photoresist is formed over the entire surface of the array substrate 310, on which light is selectively irradiated through a second half-tone mask 480.

The second half-tone mask 280 includes a first transmission region (I) that allows irradiated light to be entirely transmitted therethrough, a second transmission region (II) that allows only light to be partially transmitted therethrough while blocking the remaining light, and a blocking region (III) that entirely blocks the irradiated light. Only light which has transmitted through the second half-tone mask 480 can be irradiated onto the second photosensitive film 470.

Figure 12C:
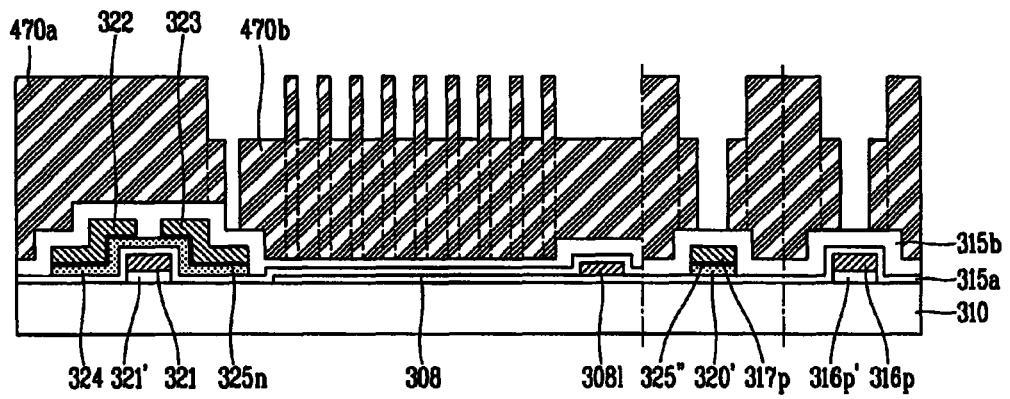

Subsequently, when the second photosensitive film 470, which has been exposed through the second half-tone mask 480, is developed, as shown in FIG. 12c, first and second photosensitive film patterns 470a and 470b each with a certain thickness remain at regions where light has been entirely blocked or partially blocked through the blocking region (III) and the second transmission region (II), and the second photosensitive film at the transmission region (I) through which light had been entirely transmitted has been completely removed to expose the surface of the passivation film 315b.

The first photosensitive film pattern 470a formed at the blocking region III is thicker than the second photosensitive film pattern 470b formed through the second transmission region II. In addition, the second photosensitive film at the region where the light had been entirely transmitted through the first transmission region I has been completely removed. This is because a positive-type photoresist has been used. However, a negative-type photoresist can be also used in embodiments of the present invention.

Figure 12D:
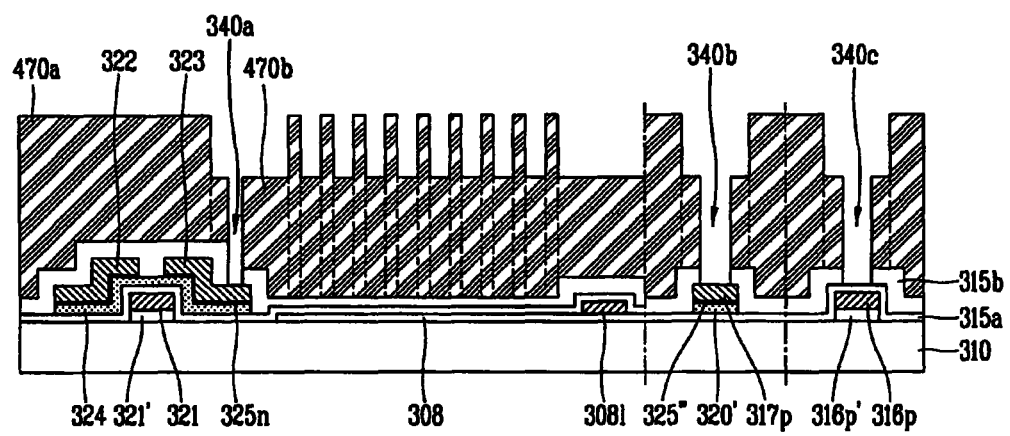

And then, as shown in FIG. 12d, a portion of the passivation layer 315b is selectively removed by using the first and second photosensitive film patterns 470a and 470b as masks to form a first contact hole 340a exposing a portion of the drain electrode 323 at the pixel part of the array substrate 310.

In addition, second and third contact holes 340b and 340c exposing portions of the data pad line 317p and the gate pad line 316p are formed at the data pad part and the gate pad part of the array substrate 310, through the third masking process.

Thereafter, the ashing process is performed to remove portions of the first and second photosensitive film patterns 470a and 470b.

Figure 12E:
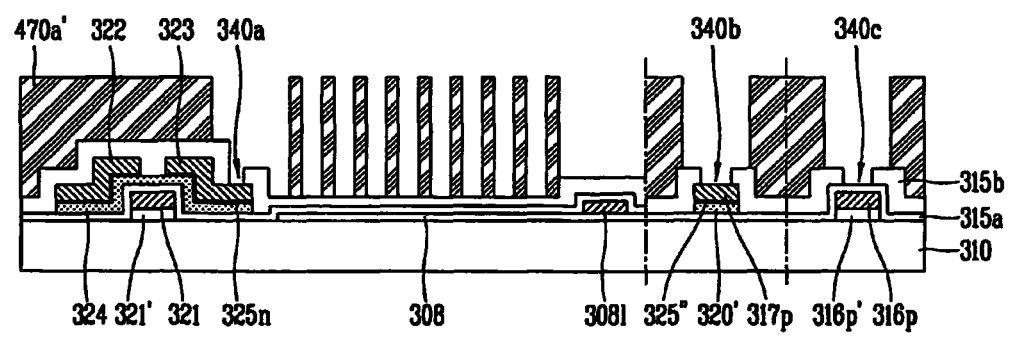

Then, as shown in FIG. 12e, the second photosensitive film pattern of the second transmission region II is completely removed. In this case, the first photosensitive film pattern remains as a third photosensitive film pattern 470a' by removing the thickness of the second photosensitive film pattern only at the region corresponding to the blocking region III. In this case, substantially, the first transmission region I and the second transmission region II, where the third photosensitive film pattern 470a' is not formed, refer to a region where a pixel electrode, a data pad electrode and a gate pad electrode are to be formed through the lift-off process (to be described).

Figure 12F:
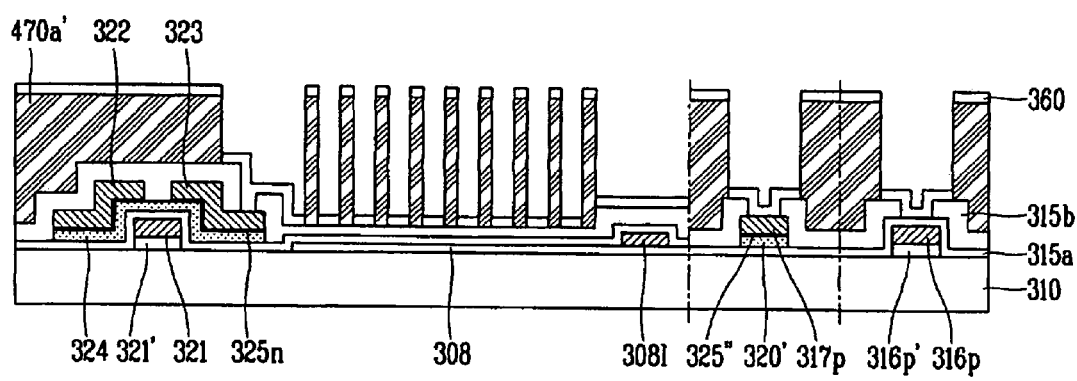

And then, as shown in FIG. 12f, a fourth conductive film 360 is formed over the entire surface of the array substrate 310.

The fourth conductive film 360 may be made of a transparent conductive material having good transmittance such as indium tin oxide (ITO) or indium zinc oxide (IZO) to form the pixel electrode, the gate pad electrode and the data pad electrode.

Here, the blocking region III where the third photosensitive film pattern 470a' remains has a certain height compared with the first transmission region I and the second transmission region II where there the third photosensitive film pattern 470' does not remain, so the fourth conductive film 360 is not formed on the side of the third photosensitive film pattern 470a'.

Figure 12G:
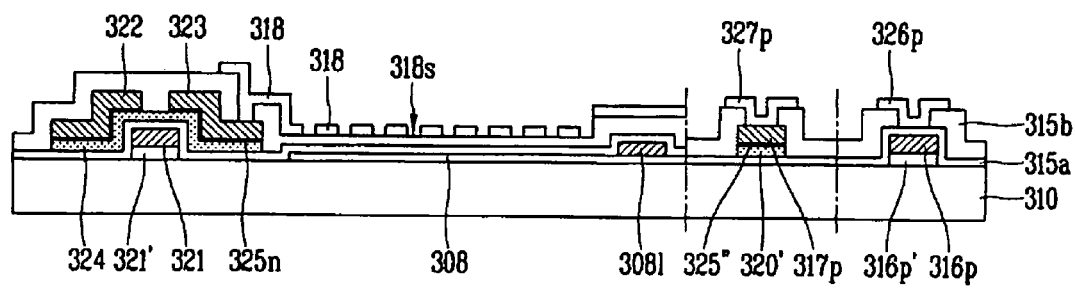

Thereafter, as shown in FIG. 12g, the third photosensitive film pattern is removed through the lift-off process, and in this case, the third photosensitive film pattern remaining at other portions than the first transmission region I and the second transmission region II and the third conductive film formed on the third photosensitive film pattern are removed together.

Here, the fourth conductive film remaining at the first and second transmission regions I and II, namely, at the interior of the first to third contact holes and on the passivation layer 315b forms the pixel electrode 318 which is electrically connected with the drain electrode 323 via the first contact hole and, at the same time, forms the data pad electrode 327p and the gate pad electrode 326p which are electrically connected with the data pad line 317p and the gate pad line 316p via the second and third contact holes, respectively.

As mentioned above, the lift-off process is a process in which the conductive metallic material such as the third conductive film is deposited with a certain thickness on the photosensitive material such as the third photosensitive film pattern and then precipitated in a solution such as a stripper to remove the photosensitive material with the metallic material deposited thereon together with the metallic material. In this case, the metallic material formed within the first to third contact holes and on the passivation film 315b remains, rather than being removed, to form the pixel electrode 318, the data pad electrode 327p and the gate pad electrode 326p.

The array substrates according to the first to third embodiments of the present invention are attached with color filter substrates in a facing manner by a sealant applied to outer edges of the image display part. In this case, the color filter substrates include black matrixes for preventing leakage of light to the TFTs, the gate lines and the data lines and color filters for implementing red, green and blue colors.

The attachment of the color filter substrates and the array substrates are made throuogh attachment keys formed on the color filter substrates or the array substrates.

In the first to third embodiments of the present invention, as the active patterns, the amorphous silicon TFT using the amorphous silicon thin film is used as an example, but the present invention is not limited thereto and as the active patterns, plycrystalline silicon TFTs using a polycrystalline silicon thin film can be also used.

The present invention can be also applied to a different display device fabricated by using TFTs, for example, an OLED (Organic Light Emitting Diode) display device in which OLEDs are connected with driving transistors.

As so far described, the method for fabricating an LCD according to the present invention, because the number of masks used for fabricating the TFTs is reduced, the fabrication process and costs can be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a liquid crystal display device comprising:
    providing a first substrate divided into a pixel part, a data pad part and a gate pad part;
    forming a common line, a gate electrode and a gate line, which are formed of an opaque conductive material, at the pixel part and a gate pad line at the gate pad part of the first substrate through a first masking process;
    forming a common electrode, a gate electrode pattern and a gate line pattern, which are formed of a transparent conductive material, under the common line, the gate electrode and the gate line, respectively, through the first masking process,
    wherein the common electrode is box-like;
    forming a gate insulation film on the first substrate;
    forming an active pattern, a source electrode, a drain electrode and a data line at the pixel part and a data pad line at the data pad part on the gate insulation film through a second masking process;
    forming a passivation layer on the first substrate with the active pattern, the source electrode, the drain electrode and the data line formed thereon;
    forming a photosensitive film pattern including a first photosensitive film pattern with a first thickness and a second photosensitive film pattern with a second thickness on the passivation layer through a third masking process;
    selectively removing a portion of the passivation layer by using the photosensitive film pattern as a mask to form a first contact hole exposing a portion of the drain electrode and to form second and third contact holes exposing portions of the data pad line and the gate pad line, respectively;
    removing portions of the first and second photosensitive film patterns to remove the second photosensitive film pattern and form a third photosensitive film pattern with a third thickness to expose top surfaces of the passivation layer in vicinities of the first, second and third contact holes and to expose intermittently portions of the passivation layer overlapping the common electrode;
    forming a transparent conductive film on the first substrate with the third photosensitive film pattern formed thereon; and
    removing the third photosensitive film pattern and the transparent conductive film on the third photosensitive film pattern to form a pixel electrode electrically connected with the drain electrode via the first contact hole and to form data and gate pad electrodes electrically connected with the data and gate pad lines via the second and third contact holes, respectively,
    wherein the pixel electrode is box-like with a plurality of slits,
    wherein the pixel electrode is larger than the common electrode to cover the common electrode, and
    wherein the pixel electrode is only formed on the exposed portions of the passivation layer.

2. The method of claim 1, wherein the slits of the pixel electrode having a certain angle and being symmetrical to each other based on the common line are formed.

3. The method of claim 1, wherein the photosensitive film pattern is formed using a half-tone mask.

4. The method of claim 1, wherein when a positive-type photoresist is used, the first thickness is thicker than the second thickness.

5. The method of claim 1, wherein the first photosensitive film pattern forms the third photosensitive film pattern upon removing certain portions by an amount that equals the thickness of the second photosensitive film pattern.

6. The method of claim 1, wherein the third photosensitive film pattern and the conductive film formed on the third photosensitive film pattern are removed by using a lift-off process.

7. The method of claim 6, wherein the third photosensitive film pattern with the conductive film formed thereon are removed together with the conductive film by using a stripper through the lift-off process.

* * * * *